United States Patent [19]
Prokoff et al.

[11] Patent Number: 5,268,645
[45] Date of Patent: Dec. 7, 1993

[54] METHOD OF AND APPARATUS FOR TESTING CIRCUIT BOARDS AND THE LIKE WITH AN INHOMOGENEOUS ELECTRIC FIELD

[75] Inventors: Manfred Prokoff, Wertheim-Reicholzheim, Fed. Rep. of Germany; Alexandr C. Schen, Moscow, U.S.S.R.; Andrey J. Poskatscheev, Moscow, U.S.S.R.; Evgeniy O. Janenko, Moscow, U.S.S.R.

[73] Assignee: ATG Electronic GmbH, Wertheim-Recholzheim, Fed. Rep. of Germany

[21] Appl. No.: 866,638

[22] Filed: Apr. 10, 1992

[30] Foreign Application Priority Data

Apr. 10, 1991 [SU] U.S.S.R. .................................. 4925774
Oct. 16, 1991 [DE] Fed. Rep. of Germany ....... 4134193

[51] Int. Cl.[5] ..................... G01R 31/02; G01R 1/067
[52] U.S. Cl. ............................. 324/537; 324/158 F; 324/530
[58] Field of Search ............ 324/50 D, 501, 522, 324/523, 527, 530, 537, 158 F, 158 P, 538; 439/482

[56] References Cited

U.S. PATENT DOCUMENTS

| | | | |
|---|---|---|---|
| 4,186,338 | 1/1980 | Fichtenbaum | 324/537 X |
| 4,870,354 | 9/1989 | Davaut | 324/158 P X |
| 4,963,822 | 10/1990 | Prokopp | 324/158 P |
| 5,006,788 | 4/1991 | Goulette et al. | 324/158 F X |
| 5,032,788 | 7/1991 | Ringleb et al. | 324/501 X |
| 5,124,660 | 6/1992 | Cilingiroglu | 324/538 |

FOREIGN PATENT DOCUMENTS

0577713  10/1977  U.S.S.R. .............................. 324/530

Primary Examiner—Gerard R. Strecker
Assistant Examiner—Diep Do
Attorney, Agent, or Firm—Darby & Darby

[57] ABSTRACT

Selected test points of conductors on the substrate of a printed circuit board are tested by positioning the circuit board adjacent an array of electrodes or by utilizing a set of conductors in or on the substrate as an array of electrodes. An electric potential is set up by applying an inhomogeneous electric field to the array of electrodes or to the conductors to be tested, and signals denoting the characteristics of the electric potential are generated. Such signals are evaluated by a suitable circuit, for example, by comparing them with reference signals which are indicative of passable or non-defective conductors, i.e., of conductors which are devoid of open and/or short circuits, or by comparing the generated signals with each other. Test probes are utilized to apply an electric field to the conductors to be tested and/or to transmit signals to the evaluating circuit.

38 Claims, 13 Drawing Sheets

METHOD OF AND APPARATUS FOR TESTING CIRCUIT BOARDS AND THE LIKE WITH AN INHOMOGENEOUS ELECTRIC FIELD

BACKGROUND OF THE INVENTION

The invention relates to improvements in methods of and in apparatus for testing printed circuit boards and like objects especially objects of the type wherein a substrate supports one or more layers of electrical conductors. More particularly, the invention relates to improvements in methods of and in apparatus for testing electrical conductors, which are installed on or in a substrate, for defects including open and short circuits.

It is already known to test the conductors of a printed circuit board with a set of test probes which are caused to contact selected test points of the conductors and are in circuit with an energy source so that an electric current is caused to flow from a first test probe to a second test probe if the momentarily tested conductor is free of defects. The results of the test are evaluated in order to ascertain whether or not the tested conductor exhibits a break (open circuit) or is short circuited. As a rule, testing of a set or charge of identical printed circuit boards is preceded by the testing of an intact (non-defective) specimen or pattern, and the signals which are generated during testing of such specimen are memorized to serve as reference signals during testing of successive printed circuit boards forming the set or charge of circuit boards to be tested. When the signals denoting the characteristics of a tested circuit board are compared with the memorized reference signals and the two sets of signals are different, the tested circuit board exhibits a defect and is segregated from circuit boards which have passed the test, or the defective board is identified as an object which has failed the test. It is also known and customary to pinpoint the locus or loci of the defective conductor or conductors in or on the substrate of a printed circuit board.

A drawback of presently known testing methods and apparatus is that reliable testing involves a very large number of steps. For example, in order to ascertain whether or not a particular conductor is properly insulated from all other conductors on or in the substrate of a circuit board, it is necessary to carry out a number of successive tests each of which involves the determination whether or not the particular conductor is properly insulated from the second, third . . . n-th conductor. The same procedure must be adhered to in connection with the testing of the second, third . . . n-th conductors. Thus, the total number (X) of steps equals $y^2 - y/2$ wherein y is the number of conductors. If a circuit board carries 1000 conductors to be tested for open and/or short circuits, and if all conductors of a satisfactory circuit board must be insulated from each other, the determination of the presence of one or more short circuits involves a total of approximately 500,000 steps. Therefore, the testing of each of a shorter or longer series of circuit boards takes up a reasonably long interval of time which is required to move pairs of test probes between nearly half a million different positions.

A presently known method of testing circuit boards is disclosed in commonly owned U.S. Pat. No. 4,963,822 granted Oct. 16, 1990 to Manfred Prokopp for "Method of testing circuit boards and the like".

OBJECTS OF THE INVENTION

An object of the invention is to provide a novel and improved method which renders it possible to complete the testing of conductors on the substrates of printed circuit boards and like objects within a fraction of the time which is required to complete the testing in accordance with heretofore known proposals.

Another object of the invention is to provide a testing method which is more economical than heretofore known methods.

A further object of the invention is to provide a method which involves the carrying out of a relatively small number of steps.

An additional object of the invention is to provide a method which can be practiced in connection with the testing of all, or at least a large majority of, printed circuit boards.

Still another object of the invention is to provide a method which can be practiced in connection with the testing of circuit boards having exposed or embedded conductors as well as in connection with the testing of circuit boards having plated-through holes.

Another object of the invention is to provide a novel and improved apparatus for the practice of the above outlined method.

An additional object of the invention is to provide the apparatus with novel and improved means for influencing the conductors of an object to be tested preparatory to and in the course of the testing operation.

Still another object of the invention is to provide novel and improved signal generating means for use in the above outlined apparatus.

A further object of the invention is to provide the apparatus with novel and improved means for manipulating test probes preparatory to and in the course of a testing operation.

Another object of the invention is to provide the apparatus with novel and improved means for influencing the conductors to be tested preparatory to and/or in the course of a testing operation.

An additional object of the invention is to provide an apparatus which can be utilized for efficient and inexpensive testing of all or nearly all presently known and utilized printed circuit boards and analogous objects.

SUMMARY OF THE INVENTION

One feature of the invention resides in the provision of an apparatus for testing electrical conductors, which are carried by a substrate, for defects including open and short circuits. The improved apparatus comprises means for applying to the conductors an inhomogeneous electric field to thus set up an electric potential, means for generating signals which denote the characteristics of the electric potential, and means for evaluating the signals. The apparatus can further comprise means for transmitting signals denoting the characteristics of the electric potential to the evaluating circuit, and the transmitting means includes at least one test probe.

The applying means can comprise an array of electrodes which set up the electric potential at the conductors. The array comprises a plurality of electrodes, and the applying means can further comprise a voltage generator and means (e.g., a multiplexer) for connecting the voltage generator with selected electrodes of the array.

The arrangement may be such that the array of electrodes forms part (a) of the means for applying an inhomogeneous electric field, or (b) of the signal generating means. The electrodes can be disposed in a plane adjacent a testing station which receives the substrate for electrical conductors to be tested. The array of electrodes (e.g., in the form of wires or strips) can be supported by (e.g., embedded in) at least one sheet-like deformable carrier. Such apparatus can further comprise means for pneumatically urging the carrier or carriers against the substrate for conductors to be tested. The urging means preferably comprises a suction generating device which attracts the carrier or carriers to the substrate for conductors to be tested. The test probe or probes which are used to contact selected test points of the conductors to be tested can be associated with means for effecting penetration of the at least one test probe into contact with one or more test points of a conductor.

The probe or probes which are to contact test points of the conductors are preferably associated with means for moving such probe or probes in three directions which are inclined (e.g., at right angles) relative to each other. The moving means can include means for moving the test probe or probes in a predetermined plane in two of the three directions, and in the third direction substantially at right angles to such plane toward and away from the conductors to be tested.

If the array of electrodes forms part of the means for applying an inhomogeneous electric field to the conductors to be tested, the signal generating means further comprises a voltage generator and a multiplexer which serves to connect the voltage generator with the array of electrodes. The multiplexer is further connected with and is arranged to receive control signals from the evaluating means.

The object to be tested can be constructed in such a way that its substrate carries a first set of conductors which are to be tested as well as a second set of conductors forming part of the applying means or of the signal generating means. Otherwise stated, the aforementioned array of electrodes can be constituted by the first set of conductors forming part of an object to be tested, and such array of electrodes can form part of the applying means or of the signal generating means.

If the conductors to be tested form at least one layer in or on the substrate of a printed circuit board or an analogous object, the array of electrodes can form at least one second layer in or on such substrate (irrespective of whether the electrodes form part of the applying means or of the signal generating means).

Another feature of the invention resides in the provision of a method of testing electrical conductors on a substrate for defects including open and short circuits. The improved method comprises the steps of applying to the conductors an electric field to thus set up an electric potential, generating signals which denote the characteristics of the electric potential, and processing the signals.

The processing step can comprise establishing reference signals which denote satisfactory conductors, and comparing the generated signals with the reference signals.

Alternatively, or in addition to the just mentioned comparing step, the processing step can comprise comparing the generated signals with each other.

The applying step can include influencing the conductors by an array of electrodes. Alternatively, the applying step can include supplying voltage impulses to the conductors (e.g., by a voltage generator through a set of test probes) and positioning an array of electrodes into the resulting electric field so that the electric potential is set up at the electrodes. The signal generating step then includes generating signals denoting the characteristics of electric potential at the electrodes.

The signal generating step can comprise contacting selected test points of the conductors with at least one conductive element, particularly a test probe. In accordance with a presently preferred embodiment, the test probe is a twin test probe having two current conducting sections which are electrically insulated from each other. Such sections are preferably separated from each other by a layer of insulating material. Pairs of twin test probes can be used to carry out a so-called guarding step. If the method is practiced by utilizing one or more twin test probes, such method can further comprise the step of moving the substrate and the conductors thereon to a predetermined position prior to the applying step, and such moving step can include contacting at least one conductor with the twin test probe, connecting the probe with a source of testing current, and changing the positions of the at least one conductor and the test probe relative to each other until the testing current actually flows through the at least one conductor between the two sections of the twin probe. Such method can further comprise the step of generating a "defect" signal in the absence of current flow between the sections of the twin test probe. The contacting, connecting and position changing steps can be repeated in connection with at least one additional conductor on the substrate; this renders it possible to properly orient the substrate and its conductors relative to an array of electrodes and/or relative to an array of test probes.

The method can further comprise the step of moving the substrate to a predetermined position prior to the applying step, and such moving step can include optically comparing the position of the substrate (e.g., by using a camera or a set of optoelectronic detectors) with the position of a reference substrate, e.g., with the position of a light transmitting (transparent or translucent) board.

If the method is carried out to test electric conductors on a substrate for a plurality of conductors which should be electrically insulated from each other, the applying step can include applying an electric field to each of the plurality of conductors and the signal generating step then includes generating signals denoting the characteristics of the electric potential which is set up by each of the electric fields. The processing step of such method can include comparing the thus obtained signals with each other to thus ascertain the presence or absence of open circuits. This can be achieved by resorting to a comparing step which includes ascertaining the identity or lack of identity of signals or by resorting to a comparing step which includes ascertaining the differences or lack of differences between the signals.

The method can further comprise the step of ascertaining the capacitance of capacitors including the conductors, and such ascertaining step can include supplying to the conductors an electric current and monitoring the current. The ascertained capacitance can be compared with a reference capacitance for the determination of open and/or short circuits.

The method can further comprise the steps of positioning the substrate adjacent an array of electrodes and alternatingly utilizing the array to apply the electric field to the conductors on the thus positioned substrate, and to generate the signals.

If the substrate is part of a printed circuit board of the type having at least two sets (e.g., layers) of conductors carried by an insulating substrate, the applying step can include utilizing one of the at least two sets of conductors to apply an electric field to the conductors of the other set.

The applying step can include utilizing a first group or set of conductors on and/or in a substrate to apply the electric field to a second group or set of conductors in or on the same substrate.

The novel features which are considered as characteristic of the invention are set forth in particular in the appended claims. The improved apparatus itself, however, both as to its construction and its mode of operation, together with additional features and advantages thereof, will be best understood upon perusal of the following detailed description of certain presently preferred specific embodiments with reference to the accompanying drawing.

DESCRIPTION OF PREFERRED EMBODIMENTS

Figure 1:
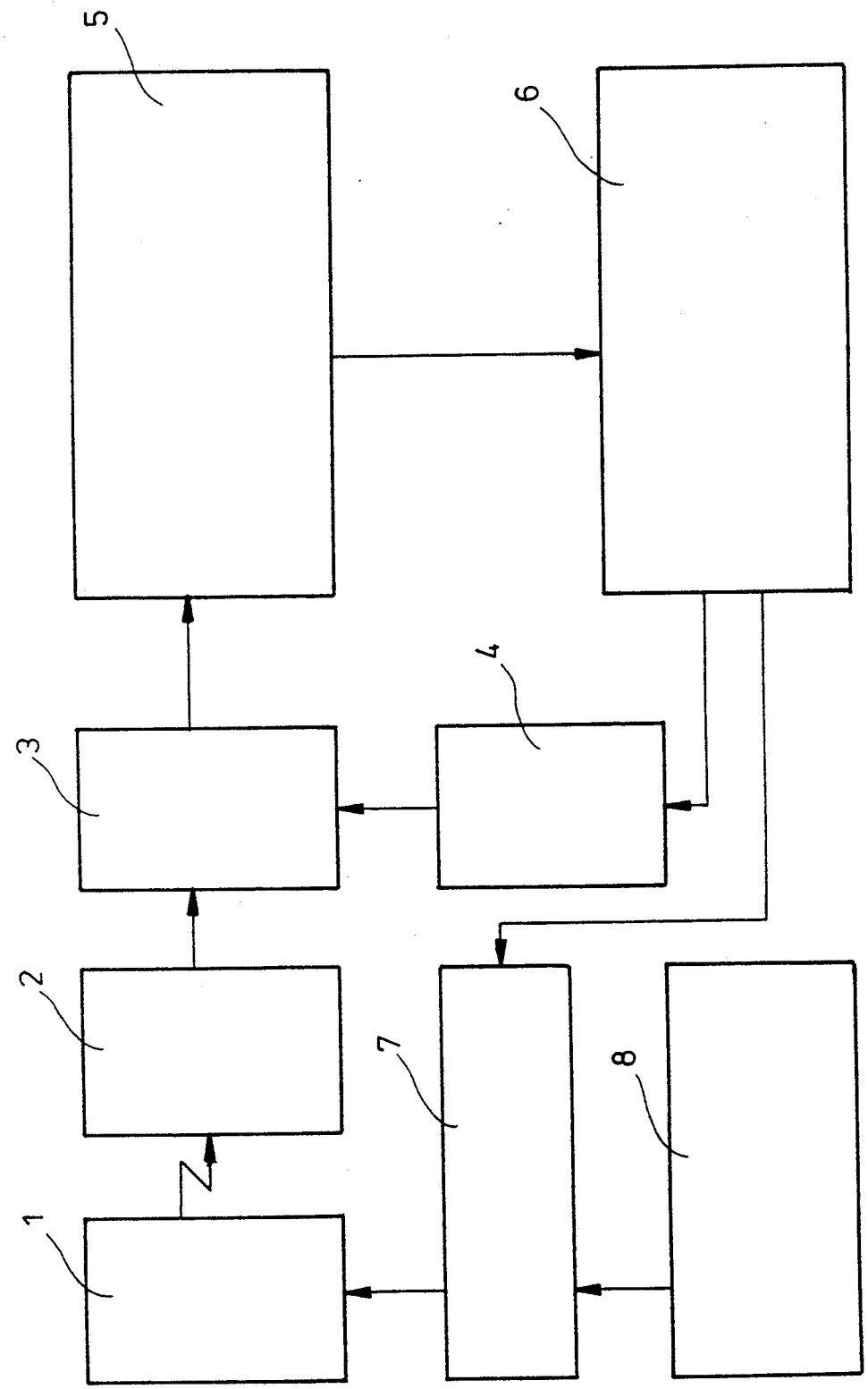
FIG. 1 a block diagram showing the essential components of an apparatus which embodies one form of the invention and wherein an array of electrodes is used to apply an electric potential to the conductors of an object to be tested.

FIG. 1 shows schematically a first embodiment of an apparatus which can be utilized for the practice of the improved method. The apparatus comprises an array 1 of electrodes which serve as a means for applying an inhomogeneous electric field to the conductors 25 (see particularly FIG. 6) on the substrate 24 of an object to be tested, such as a printed circuit board 2. The array of electrodes 1 can also be termed a set of antennae. The electric field which is applied by the array 1 of electrodes sets up an electric potential which is utilized to ascertain the presence or absence of defects in the set of conductors 25 on or in the substrate 24 of the printed circuit board 2 (hereinafter called board for short). The defects include open and/or short circuits. Selected test points of the conductors 25 are contacted by the tips of a group of test probes 3 which are movable between a plurality of different positions by a mechanical moving or positioning unit 4. Signals which are transmitted by the probes 3 contacting the conductors 25 are indicative of the electric potential, and such signals are transmitted to an evaluating circuit 6 through measuring channel 5. The latter contains an analog/digital converter. The evaluating circuit 6 controls the application of an electric field to the conductors 25 through a multiplexer 7 which is connected between the array 1 of electrodes and a voltage generator 8. One or more outputs of the evaluating circuit 6 transmit signals to the moving or positioning unit 4 which selects the positions of test probes 3 relative to selected test points of the conductors 25. The circuit 6 can evaluate signals which are generated at 2, 3 and are transmitted to the evaluating circuit via channel 5 in any suitable way, preferably by comparing such signals with reference signals which are indicative of an ideal specimen or pattern, e.g., a printed circuit board which has been found to be devoid of any open and/or short circuits and is identical with the board or boards to be tested.

The multiplexer 7 serves to apply voltages from the voltage generator to the electrodes of the array 1 in dependency upon control signals from the evaluating circuit 6.

In order to carry out a testing operation, the board 2 whose conductors 25 are to be tested for the presence or absence of open and/or short circuits is placed into the electric field which is applied by the electrodes of the array 1. The evaluating circuit 6 then proceeds to transmit signals to the moving unit 4 which moves the test probes 3 to a selected number of different positions relative to the board 2 in order to apply the test probes 3 to a desired number of test points, and such test points are contacted in a sequence determined by the evaluating circuit 6 and unit 4. The arrangement is preferably such that the unit 4 is designed to move a plurality of test probes 3 in a number of different directions, for example, in directions X, Y and Z at right angles to each other as is known from the cartesian coordinate system. This will be described in greater detail with reference to FIG. 17.

Figure 2:
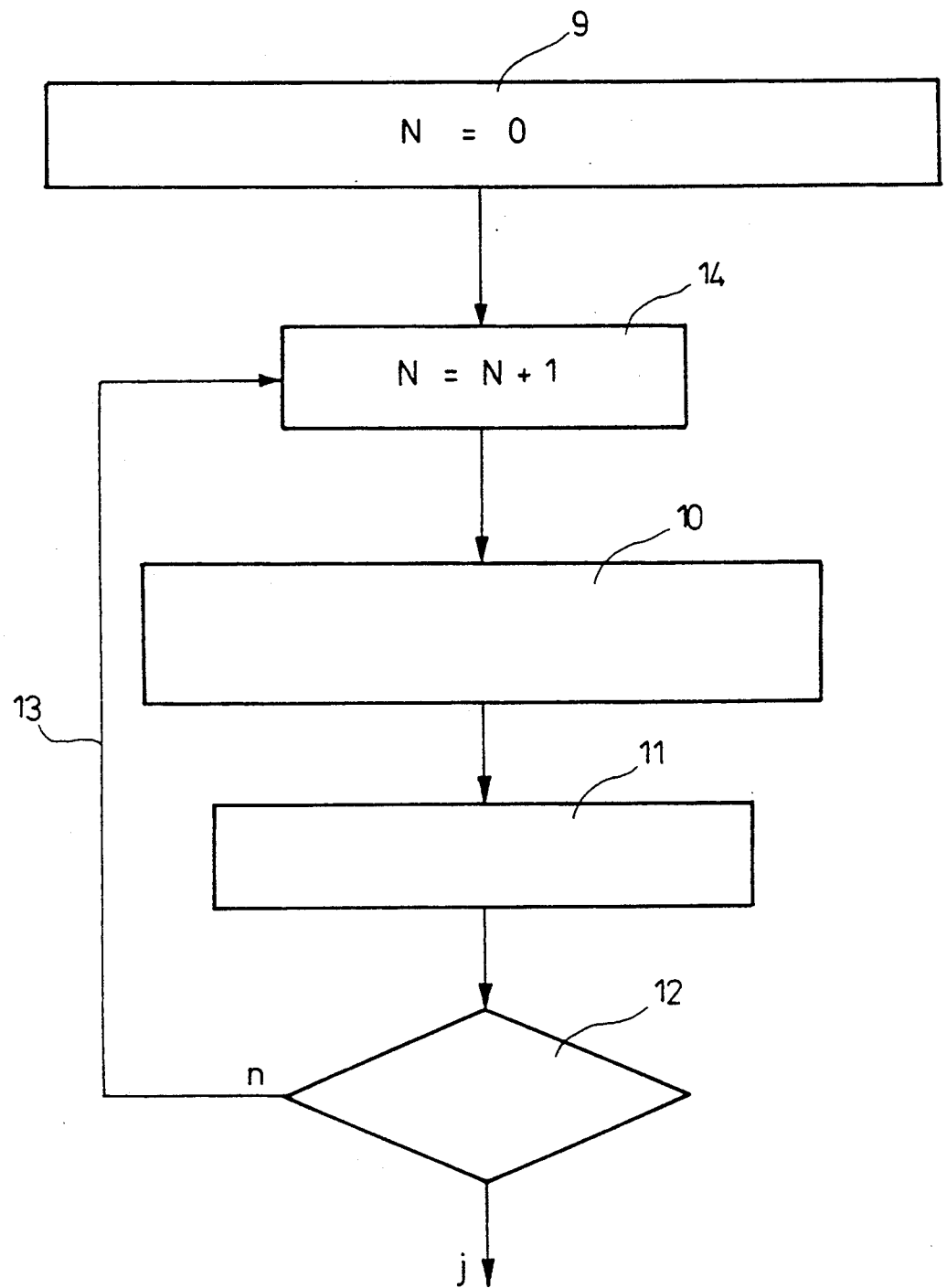
FIG. 2 is a flow diagram of the working algorithm of the apparatus.

The flow diagram of FIG. 2 shows a test point N (step 9) which is contacted by a test probe 3 in a following step denoted by the character 14. The step 10 denotes the positioning of a test probe 3 relative to the test point N, and the step 11 denotes the actual measuring or signal generating step. Thus, the potential at the test point N of a selected conductor 25 is ascertained and a corresponding signal is transmitted from the test probe 3 to the evaluating circuit 6 through the channel 5. The next step 12 involves a determination whether or not all test points requiring contacting by a test probe 3 were indeed contacted. If this is not the case, a negative signal n is transmitted via lead 13 to initiate a repetition of the steps 14, 10, 11 and 12. Thus, the second step 14 involves a renewed counting as expressed by the equation $N = N + 1$. If the step 12 results in a determination that all selected or contemplated test points were indeed contacted by the test probe or probes 3, the step 12 is terminated at the yes branch, i.e., the working algorithm of the apparatus is completed.

Figure 3:
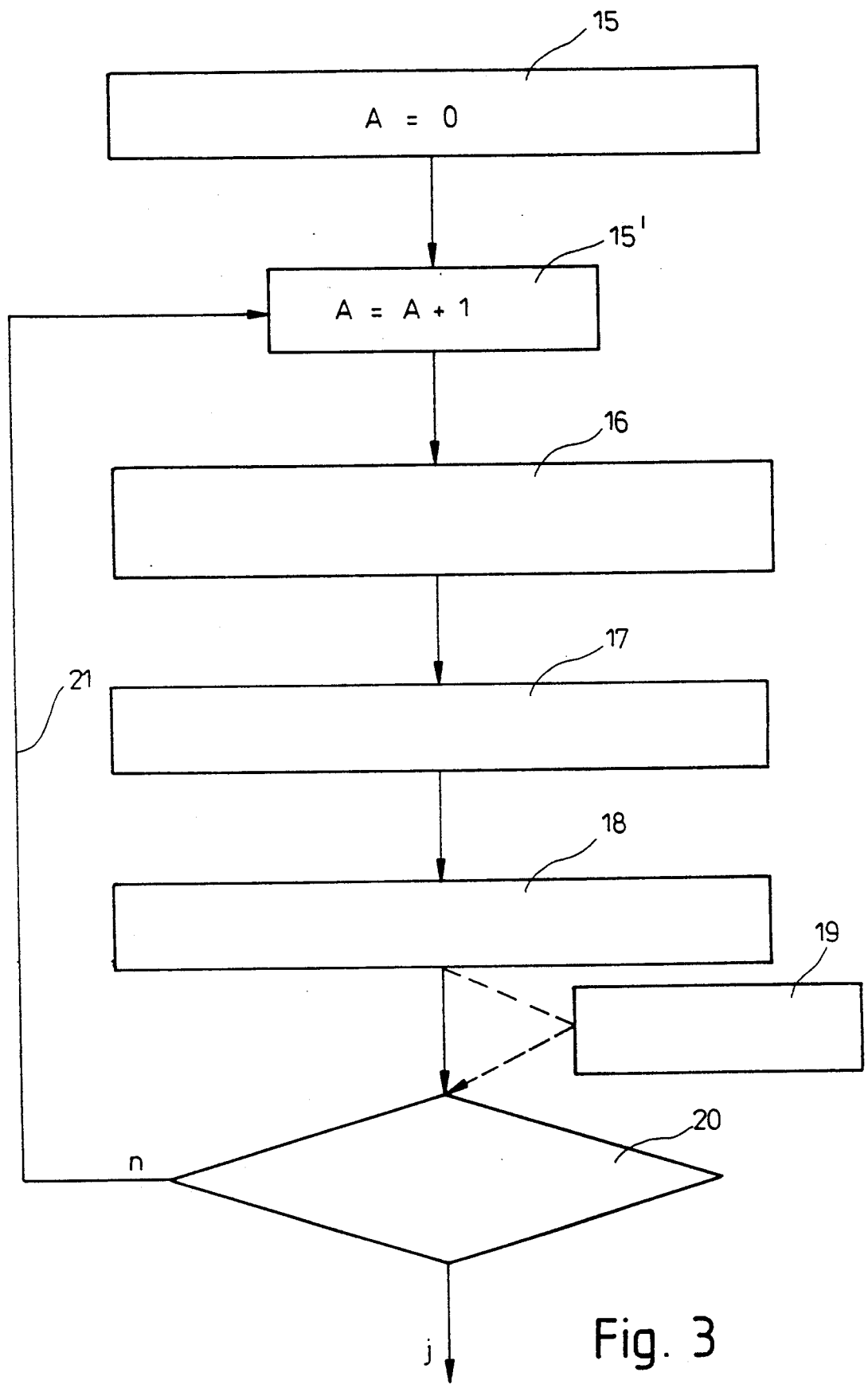
FIG. 3 is a flow diagram of the measuring cycle algorithm of the apparatus.

The flow diagram of FIG. 3 depicts the measuring cycle algorithm of the apparatus of FIG. 1. The steps 15, 15' involve the selection of a particular set A of electrodes from the array 1. Such set A includes electrodes which must be connected with the voltage generator 8 via multiplexer 7 in order to apply a given electric field which is necessary to set up an electric potential in the conductors 25 of the board 2 which is located at the testing station. The step of selecting a set A of electrodes with the multiplexer 7 is shown at 16, and the step 17 denotes the actual application of selected potential from the generator 8 to the set A of electrodes forming the array 1. The step 18 corresponds to the step 11 in the flow diagram of FIG. 2, i.e., the potential at different test points of the conductors 25 is ascertained and corresponding signals are transmitted to the evaluating circuit 6 through the test probes 3 and channel 5.

If necessary, the method can further include the step of ascertaining (at 19 in FIG. 3) the capacity of the network by ascertaining the current. The step 20 of FIG. 3 involves ascertaining whether or not the desired number of sets A (groups of electrodes in the array 1) has been reached. If the result is negative, a lead 21 transmits a signal to repeat the steps 16, 17, 18 and 20 in accordance with the equation $A = A + 1$. If all of the sets A are realized, the step 20 is terminated at the yes arm of 20 in FIG. 3.

Figure 4:
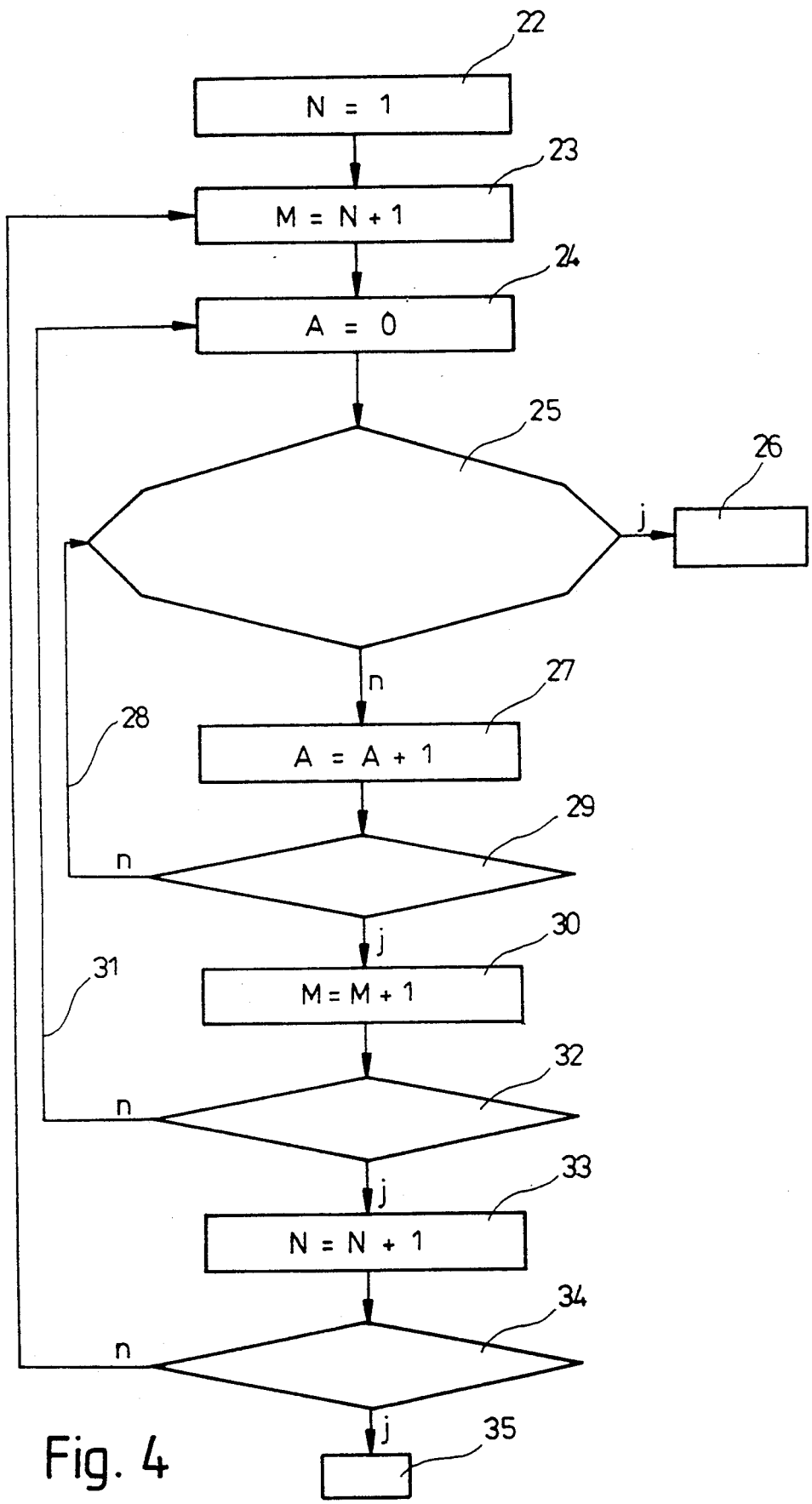
FIG. 4 is a flow diagram of the algorithm denoting the analysis of test results.

The flow diagram of FIG. 4 denotes the algorithm of an analysis of the results of testing a board 2. Test points of the conductors 25 which have been contacted and are to be checked are selected in steps 22 and 23. The test points are checked using signals obtained upon energization with a set of electrodes which are connected with the generator 8 through the multiplexer 7 (step 24). In two instances, the algorithm proceeds from the step 25 to the step 26; this denotes that the board 2 which is being tested is defective.

Such situation arises if (1) the potentials at two test points N and M of the same conductor 25 are different, and (2) if the potential at two test points N and M of different conductors is the same for a selected set A of electrodes. In one instance (i.e., if the potentials at the points N and M of a given conductor 25 are the same), the conductor which is being tested exhibits a break (open circuit). In the other instance (i.e., if the potential between the points N and M on different conductors 25 is the same for each selected set A of electrodes), the apparatus has detected a short circuit. The following equation applies for the step 25:

$$|U(N, A) - U(M, A)| > \Delta U.$$

U denotes the potential, and $\Delta U$ denotes a potential difference which must remain within the range of an acceptable measuring error. Thus, if the difference between the potentials as per above equation exceeds $\Delta U$, the board 2 which is being tested is defective and this results in a step 26, namely an indication or reporting of the detected defect. If the ascertained potential difference is less than $\Delta U$, the next step 27 involves a repetition of the aforedescribed steps but with a different set (A + 1) of electrodes. The number of sets (A, A + 1, etc.) is selected in advance and, when the total number of sets is reached, the loop 28 is no longer repeated, i.e., one proceeds with the steps 29 and 30. The step 30 involves the selection of a further test point on a conductor 25, and the aforedescribed operation is then repeated (note the loop 31) with all selected sets A, A + 1, etc. of electrodes. When the testing of all selected test points of a conductor 25 is completed (step 32 in FIG. 4), the steps 33 and 34 are carried out to reach the first test point of the next conductor 25 to be tested and the test involving such next conductor is then carried out in the same way as already described above. The program is terminated (step 35), when the testing of the entire board 2 is completed.

The electrode array 1 sets up an inhomogeneous electric field which is applied to the conductors 25 on the substrate 24 of the board 2 so that the test probes 3 can transmit signals denoting the characteristics of at least one electrical potential which is set up at the board. The thus obtained signals are compared (a) with signals denoting the characteristics of electrical potential at other test points and/or (b) with reference signals. Thus, in accordance with the heretofore described method of the present invention, the electrodes of the array 1 establish an electric field and, when the board 2 to be tested is introduced into such field, the field intensity or field strength at the conductors forming part of the board establishes an electric potential which is monitored with test probes 3. Since the conductors 25 are made of an electrically conductive material, the potential at any point of a continuous uninterrupted conductor 25 is the same. However, if the circuit of a particular conductor 25 is open (e.g., because the conductor is damaged and consists of two or more parts rather than constituting a single uninterrupted electrical line), there develops a potential difference between two parts of a damaged conductor. This is ascertained with the test probes 3, and the evaluation of corresponding signals in the circuit 6 leads to the conclusion that the circuit of the tested or monitored conductor 25 is open.

On the other hand, the potentials at conductors 25 which are electrically insulated from each other are different. Consequently, inhomogeneousness of the electric field which is applied by the array 1 results in detection of different potentials between the text points of conductors 25 which are insulated from each other. This enables the evaluating circuit 6 to ascertain the fact that the conductors 25 are insulated from each other, i.e., the evaluating circuit 6 ascertains the absence of a short circuit. The evaluating circuit 6 carries out such determination again and again until all of the selected test points are contacted by the test probes 3 so that the circuit 6 can generate a signal which indicates that the board 2 which was placed adjacent the electrode array 1 has passed the test.

The term "inhomogeneous electric field" is intended to denote that, when a board 2 is satisfactory, the potential at a first conductor 25 is different from the potential at a second conductor 25 which is electrically insulated from the first conductor. This renders it possible to carry out a reliable test because of the differences between various potentials. If the potential at conductors 25 which should be electrically insulated from each other is the same, the apparatus cannot ascertain the presence or absence of a short circuit, i.e., whether or not the tested conductors are electrically connected to each other. For example, the potential at two conductors which should be electrically insulated from each other will be the same due to a corresponding distribution of field strength. If this is the case, the apparatus cannot ascertain whether or not the potential is the same due to a defect (short circuit) or accidentally.

In order to ascertain whether or not a conductor 25 (or a set of conductors 25 which are electrically connected to each other) exhibits a break (open circuit), it is necessary to contact selected test points of such conductor by test probes 3. For example, the probes will be caused to contact the terminals of a conductor, i.e., those points which are to be welded, soldered or otherwise electrically connected with electrical and/or electronic components of a finished printed circuit board. No interruption exists if the potential at all test points is the same. A signal denoting such potential is stored in the evaluating circuit 6. The test as to the presence or absence of open circuits is carried out upon completed testing of the last of a shorter or longer series of separate conductors or sets of electrically interconnected conductors. The presence or absence of short circuits is thereupon determined by comparing the signals denoting the potentials of successively tested discrete conductors (which should be electrically insulated from one another) with each other. Thus, it will be noted that, once each of a number of discrete conductors 25 has been tested for the presence or absence of an open circuit, it is not necessary to utilize the test probes again for the purpose of ascertaining the presence or absence of short circuits; all that is necessary is to compare the stored data for the purpose of ascertaining whether or not the data denoting potentials at various electrically insulated (or presumably electrically insulated) conductors are sufficiently different from each other to warrant the conclusion that such conductors are indeed electrically insulated from one another. Thus, if such purely "mathematical" testing for the presence or absence of short circuits (without test probes) indicates that the potentials at conductors which are supposed to be electrically insulated from each other are indeed different, this constitutes a clear indication that the conductors are indeed insulated from one another.

If the "mathematical" testing determines the presence of two conductors having the same potential, this can have taken place for two reasons, namely: (1) there is an undesirable short circuit, or (2) the identical potential has developed due to an accident or coincidence (e.g., due to corresponding distribution of the electric field). In other words, if the potential is identical due to a coincidence, the electric field does not exhibit the aforediscussed desirable inhomogeneousness. The problem can be overcome by carrying out a correction of the electric field in order to ensure that the just discussed conductors exhibit different potentials. Alternatively, one can proceed in a manner well known from the art, namely by forming a measuring loop with two test probes to ascertain the presence or absence of a short circuit and/or an open circuit.

The aforediscussed feature of the improved method, namely that it is not necessary to ascertain the presence or absence of short circuits by resorting to test probes, contributes to a significant shortening of the test. Thus, all that is necessary is to memorize signals which were generated during testing of a board 2 for the presence of open circuits, and such memorized signals are thereupon used for the aforediscussed "mathematical" determination of the presence or absence of short circuits.

Figure 5:
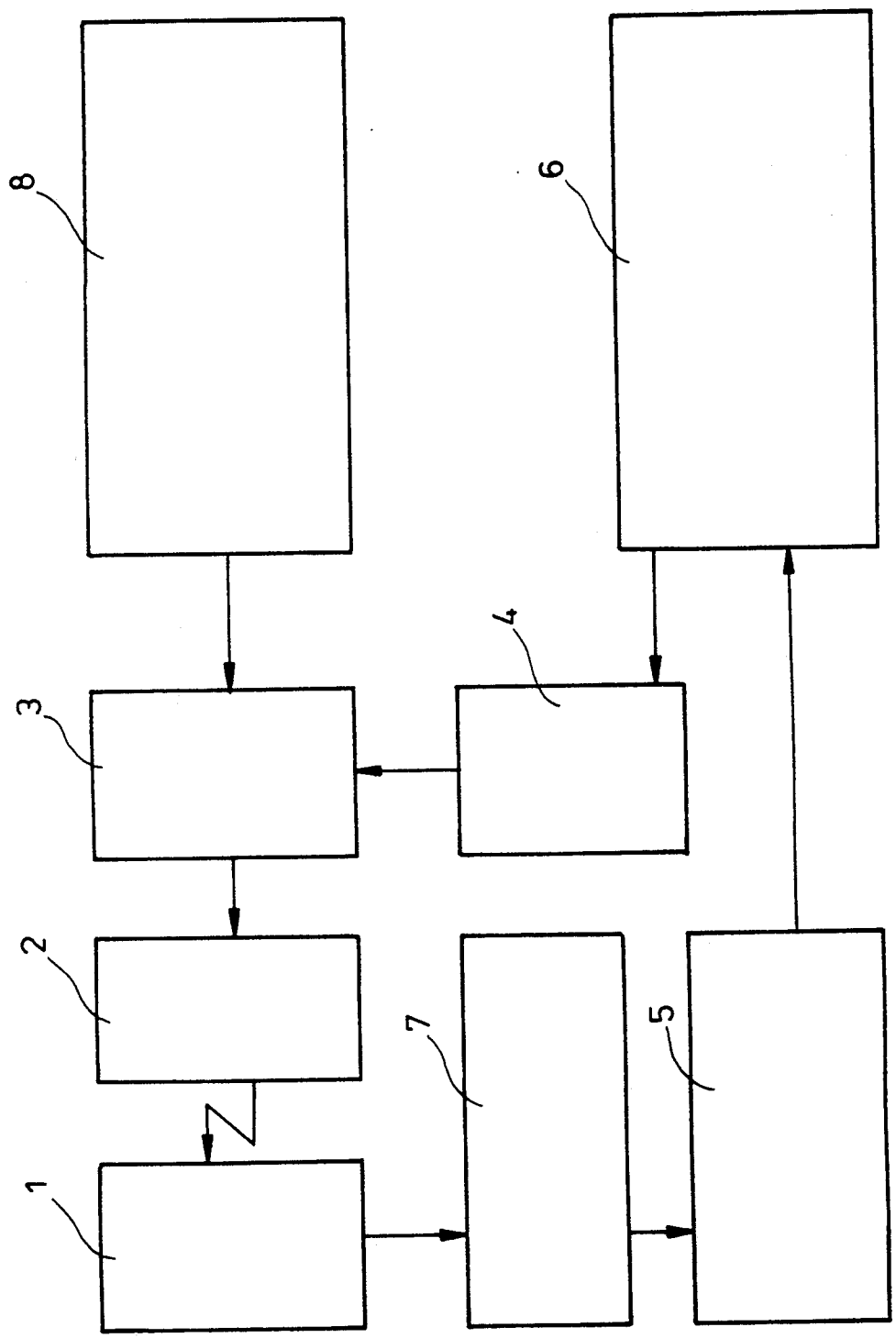
FIG. 5 is a block diagram showing the essential components of an apparatus which embodies another form of the invention and wherein an array of electrodes is influenced by the conductors of an object to be tested.

FIG. 5 shows a second embodiment of the improved apparatus. The operation of this apparatus can be said to be the reverse of the aforedescribed operation of the apparatus of FIG. 1. Thus, the conductors 25 of the board 2 assume the function of electrodes in the array 1 of FIG. 1, and the electrode array 1 of FIG. 5 is acted upon by an inhomogeneous electric field to set up an electric potential which is sampled and used for the generation of signals denoting the characteristics of the electric potential and hence the presence or absence of defects in certain conductors of the board 2. The voltage generator 8 is connected with the test probes 3 which, in turn, contact selected conductors of the board 2 in order to apply an electric field to sets of electrodes forming part of the array 1. The electrodes of the array 1 are connected with the evaluating circuit 6 through the multiplexer 7 and channel 5. The evaluating circuit 6 transmits signals which control the mechanical positioning or moving unit 4 for the test probes 3.

The mode of operation of the apparatus of FIG. 5 is analogous to the aforedescribed mode of operation of the apparatus which is shown in FIG. 1.

The method which can be practiced with the apparatus of FIG. 5 differs from the method which can be practiced with the apparatus of FIG. 1 primarily in that the roles of the conductors 25 of the board 2 and of the array 1 electrodes are interchanged. However, the basic principle is the same, i.e., there is applied an inhomogeneous electric field which sets up an electric potential, and such potential is monitored and utilized for the generation of signals which are indicative of the characteristics of the potential and can be processed or evaluated to ascertain the presence or absence of short circuits and/or open circuits. Again, the presence of short circuits can be ascertained by comparing data which are obtained and memorized during determination of the presence or absence of short circuits. Thus, the aforementioned "mathematical" testing can be relied upon again in order to avoid repeated manipulation of test probes solely for the purpose of determining the presence or absence of short circuits.

The distribution of potential which is set up as a result of connection of selected conductors 25 of the board 2 of FIG. 5 with the voltage generator 8 via test probes 3 departs from the desired distribution if the conductors 25 of the board 2 of FIG. 5 (such conductors then act as electrodes) are short circuited or form open circuits. Errors are detected by the evaluating circuit 6 which receives signals from the electrode array 1 of FIG. 5 through the multiplexer 7 and channel 5.

Figure 6:
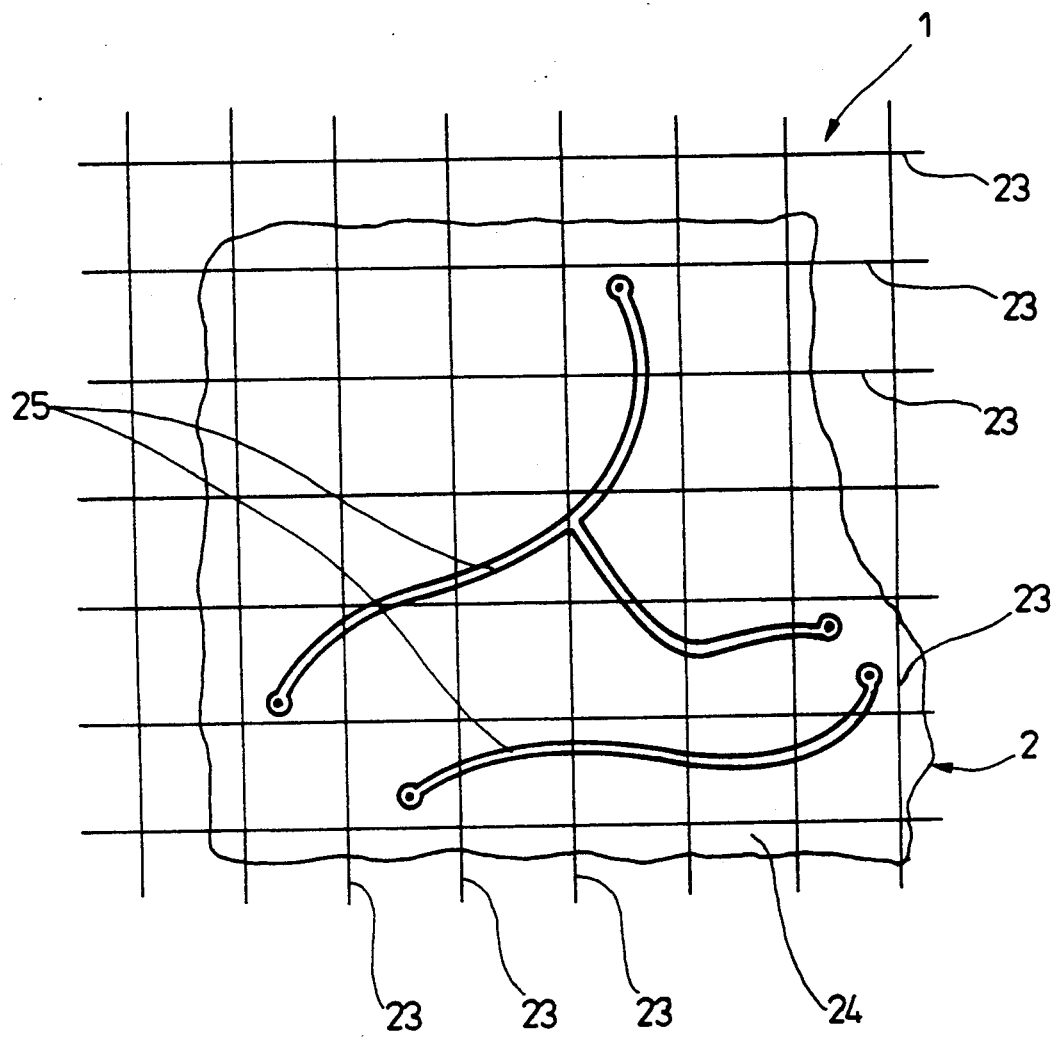
FIG. 6 is a schematic plan view of a portion of an array of electrodes and of the adjacent portion of an object to be tested.

FIG. 6 shows certain details of an electrode array 1 which can be utilized in the apparatus of the present invention. The wire-like electrodes 23 of this array form a grating with two sets of parallel wires. The wires of one set cross the wires of the other set at an angle of 90°. The crossing wires are electrically insulated from each other. The multiplexer 7 selects certain wires 23 to connect such selected wires with the voltage generator 8 for the application of a given electric field to the conductors 25 of the board 2 which is to be tested.

FIG. 6 further shows a portion of a printed circuit board 2 having a substrate 24 and electric conductors 25 at one side of the substrate. If the board 2 of FIG. 6 is to be tested in the apparatus of FIG. 1, selected wires 23 of the grating are connected with the voltage generator 8 to develop an inhomogeneous electric field which is applied to the conductors 25. If the board 2 of FIG. 6 is to be tested in the apparatus of FIG. 5, the voltage generator 8 and the test probes 3 cooperate to apply voltage to conductors 25, and the developing electric field is applied to the wire-like electrodes 23 which set up an electric potential. The potential is sampled via multiplexer 7 and channel 5, and corresponding signals are transmitted to the evaluating circuit 6.

Figures 7, 8:
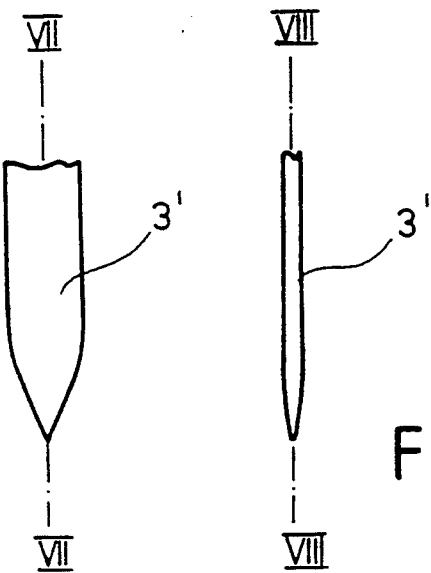
FIG. 7 is a fragmentary side elevational view of a test probe which can be utilized in the apparatus of the present invention.
FIG. 8 is an end elevational view of that portion of the probe which is shown in FIG. 7.
Figures 9, 10:
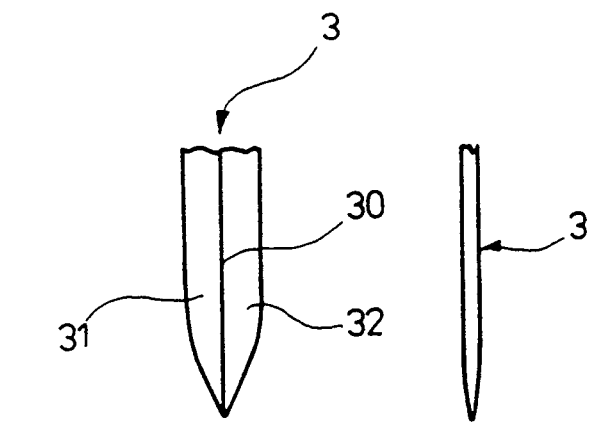
FIG. 9 is a side elevational view of a portion of a twin probe which can be utilized in the improved apparatus.
FIG. 10 is an end elevational view of that portion of the twin probe which is shown in FIG. 9.

FIGS. 7 and 8 illustrate one form of a test probe 3' which can be utilized in the apparatus of FIG. 1 or 5. At least the tip of this test probe (namely the portion which contacts an electrode or a conductor 25) resembles a flat blade which can be used with particular advantage to contact pads, to enter plated-through or other bores or holes of a circuit board and for similar or analogous purposes. The illustrated portion of the test probe 3' has two halves which are mirror images of each other in the plane VII—VII of FIG. 7 or in the plane VIII—VIII of FIG. 8.

FIGS. 9, 10 and 13 to 16 show another presently preferred (twin) test probe 3 which has two mirror symmetrical halves or sections 31, 32 and an insulating layer 30 between such sections. The sections 31, 32 can be separately connected to a testing circuit, such as the circuit 43 of FIG. 14. Test probes 3 can be utilized with advantage for so-called four wire measurement (guarding). Furthermore, a twin test probe 3 can be utilized to carry out highly reliable tests and such probe renders it possible to readily detect the establishment of improper contacts or less than optimal contacts (contact or transition resistance). This can be achieved by setting up a testing circuit (43 in FIG. 14) for the flow of electric current between the sections 31, 32 and through a conductor 25 which is contacted by the tips of such sections. The contacts between the sections 31, 32 and the conductor 25 are satisfactory if the flow of electric current is satisfactory. If the flow of current between the tips of the sections 31, 32 is less than satisfactory, this indicates the existence of a pronounced contact or transition resistance or the absence of any flow, i.e., the connection is defective or non-existent.

Figure 11:
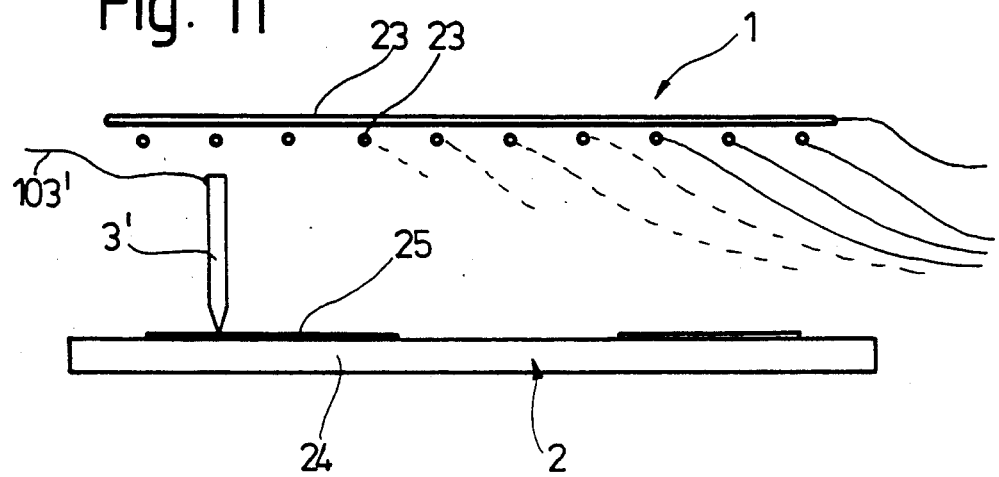
FIG. 11 is a fragmentary side elevational view of an array of electrodes adjacent a printed circuit board which is to be tested, the array of electrodes being similar to that which is shown in FIG. 6.

FIG. 11 shows a board 2 having a substrate 24 of insulating material and conductors 25 at the upper side of the substrate. Movements of test probes 3' (only one shown in FIG. 11) are initiated and controlled by the moving unit 4 which is not shown in FIG. 11. Such moving unit can shift the illustrated probe 3' in the directions of the X-, Y- and Z-axes of a cartesian coordinate system, preferably in such a way that movements in the directions of the X- and Y-axes take place in a plane which is parallel or nearly parallel to the upper side of the substrate 2 in order to properly align the tip of the probe 3' with a selected test point of the adjacent conductor 25. The moving unit 4 moves the probe 3' in the direction of the Z-axis in order to move the tip of the probe 3' into or away from contact with the selected test point of the adjacent conductor 25. In the apparatus which embodies the structure of FIG. 11, a test probe 3' must be lowered into contact with a test point on the adjacent conductor 25 and such probe is raised in order to be disengaged from the conductor.

The array 1 which is shown in the upper part of FIG. 11 employs electrodes 23 in the form of wires crossing each other and being insulated from one another in a manner as described with reference to FIG. 6. A lead 103' is provided to connect the test probe 3' of FIG. 11 with the channel 5 (FIG. 1) or with the generator 8 (FIG. 5). If the structure of FIG. 11 is embodied in the apparatus of FIG. 1, the illustrated test probe 3' forms part of the means for transmitting voltage signals from the conductors 25 of the board 2 to the evaluating circuit 6 through the channel 5. If the structure of FIG. 11 forms part of the apparatus of FIG. 5, the test probe 3' forms part of means for transmitting voltage signals from the generator 8 to the conductors 25 so that the board 2 applies an inhomogeneous electric field to the electrodes (such as 23) of an array 1 whereby the electric field sets up a potential whose characteristics are determined and corresponding signals are generated and transmitted to the evaluating circuit 6 via multiplexer 7 and channel 5 of FIG. 5.

Figure 12:
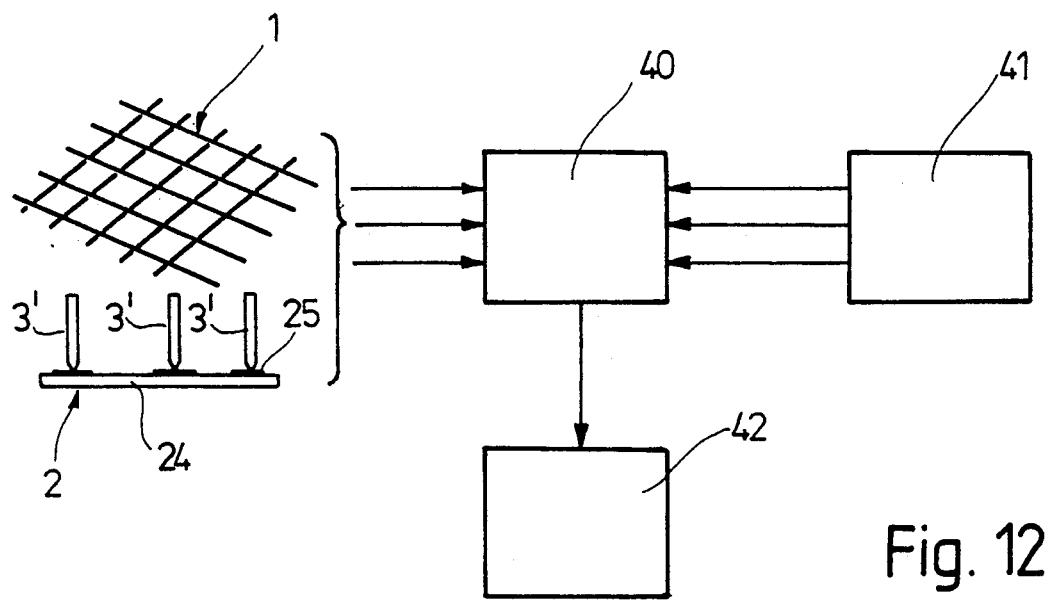
FIG. 12 is a block diagram showing the electrode array of FIG. 6 or 11 adjacent a set of test probes which engage the conductors of an adjacent printed circuit board, and further showing certain electronic components of the system which receives and processes signals denoting the electric voltage at the conductors of the circuit board.
Figure 13:
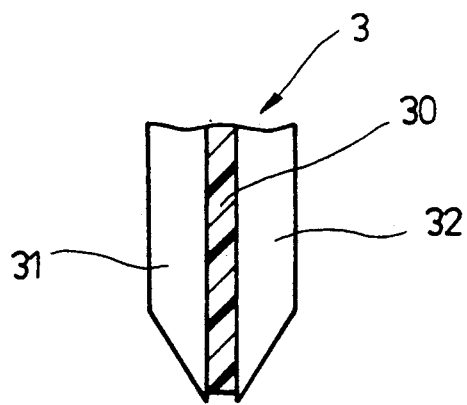
FIG. 13 is an enlarged view of a portion of a twin test probe resembling the test probe of FIGS. 9 and 10.

FIG. 12 shows that signals which are transmitted via test probes 3' (which contact conductors 25 on the substrate 24 of a board 2) are applied to the corresponding inputs of a comparator 40 which receives reference signals from a memory 41 and transmits signals denoting the difference between the signals from 3' and the signals from 41 to a signal evaluating circuit 42. Reference signals which are stored in the memory 41 and are sampled by the comparator 40 can denote the characteristics of an ideal board, i.e., a specimen which is devoid of any open and/or short circuits and, therefore, its characteristics are matched by those of a non-defective (passable) board 2. The circuit 42 transmits a signal which is indicative of a passable board 2 or a signal which denotes that the freshly tested board exhibits a defect, such as an open circuit and/or a short circuit. A board 2 which has caused the circuit 42 to generate a "defect" signal is segregated from other (satisfactory) tested boards.

It is normally preferred to design the structure of FIG. 12 in such a way that the comparator 40 transmits to the evaluating circuit 42 signals denoting the defective conductor 25 of the board 2 which is being tested. Such specific information is desirable and necessary in order to rapidly repair the defective board 2 without the need for additional detailed testing of this board.

Figures 14, 15:
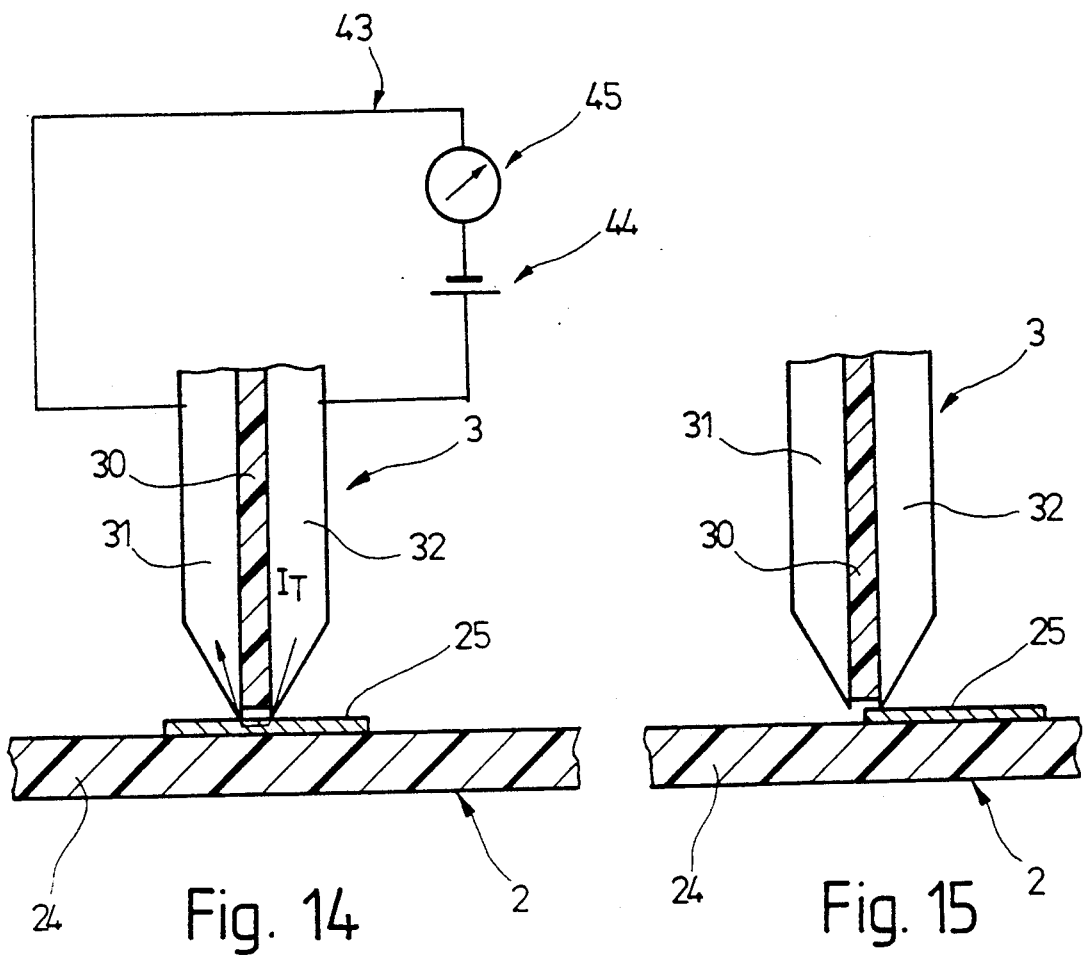
FIG. 14 illustrates certain details of a testing circuit which is used to ascertain the position and orientation of a twin test probe relative to the adjacent conductor of a printed circuit board to be tested.
FIG. 15 illustrates a portion of the testing circuit of FIG. 14, with the circuit board shifted relative to the test probe.

FIG. 14 illustrates a twin test probe 3. The pointed tips of the sections 31, 32 of this probe contact a conductor 25 on the insulating substrate 24 of the board 2. The probe sections 31, 32 are connected into the aforementioned testing circuit 43 which further includes an energy source (potential source) 44 and a detector 45 in series with the energy source 44 and test probe 3. One pole of the energy source 44 is directly connected with the section 32 of the test probe 3, and the other pole of this energy source is connected with the section 31 through the detector 45.

When the tips of the sections 31, 32 are lowered in the direction of the aforediscussed Z-axis of a cartesian coordinate system defined by the moving unit 4 to contact the adjacent conductor 25, the testing circuit 43 is completed if the conductor 25 is satisfactory and if the contact between such conductor and the tips of both sections 31, 32 is satisfactory. The flow of a test current $I_T$ between the tips of the sections 31, 32 (i.e., through the conductor 25) further indicates that the orientation of the test probe 3 is satisfactory. Once the just described testing of the probe 3 is completed, this probe is ready to participate in the testing of the conductor 25, i.e., to transmit signals to the channel 5 of FIG. 1 or to a conductor 25 on the board 2 of FIG. 5.

FIG. 14 shows the probe 3 in proper orientation and in proper position in the plane of the X- and Y-axes, i.e., the tips of both sections 31, 32 of this probe actually contact a selected conductor 25. On the other hand, FIG. 15 shows an improper position of the test probe 3, i.e., the tip of the left-hand section 31 is not in contact with the conductor 25 which, however, is contacted by the tip of the right-hand section 32. This is ascertained by the detector 45, and a signal from this detector is used to shift the tips of the sections 31, 32 in a plane which is parallel to the upper side of the substrate 24 until the tips of both sections 31, 32 engage the adjacent conductor 25. The procedure is analogous if the probe 3 descends and the tips of both sections 31, 32 fail to contact a conductor 25. In either event, the probe 3 is moved sideways until the sections 31, 32 engage a selected conductor 25 in a manner as shown in FIG. 14, i.e., until a test current $I_T$ begins to flow between the sections 31, 32 across a conductor 25.

FIGS. 14 and 15 further show that the test probes 3 can be used for electrostatic testing of conductors 25 on the substrate 24 of a board 2 as well as for conveying of test currents $I_T$ through selected conductors or all conductors. This might be necessary for the aforediscussed reasons (such as to determine the position of a test probe relative to the adjacent conductor) as well as for other reasons, for example, to determine the current carrying capacity of a conductor 25. Such determination of the current carrying capacity of a conductor can be made by resorting to two discrete test probes (such as two test probes 3' of the type shown in FIGS. 7 and 8) or to a single twin test probe 3 wherein the sections 31, 32 (i.e., two probes) are separated from each other by an insulating layer 30. Though it is possible to monitor the current carrying capacity by resorting to current supplying and current removing parts other than test probes 3 or 3', the illustrated design is preferred at this time because the probes 3 or 3' can perform plural functions including applying voltage to the conductors 25 (FIG. 5), transmitting from conductors signals which denote the characteristics of the voltage (FIG. 1), and conveying electric current to and from the conductors (FIGS. 14 and 15).

If the section 31 or 32 of the test probe 3 which is shown in FIG. 14 does not contact the adjacent conductor 25, this can denote that the orientation of the test probe relative to the properly positioned or oriented board 2 must be changed, that the orientation of the board 2 relative to the test probe 3 (and hence relative to the electrode array 1) is incorrect, or that the orientation of the test probe 3 as well as the orientation of the board 2 are incorrect. Therefore, tests with a current $I_T$ are carried out prior to actual testing of a board for the presence or absence of open and/or short circuits because testing with the current $I_T$ renders it possible to carry out the necessary changes of orientation and/or position of a test probe relative to the adjacent board and/or changes of orientation and/or position of the board 2 relative to the array 1 before the actual testing operation begins. Any changes in the position of the board 2 are carried out by shifting the board relative to the test probe until the detector 45 begins to indicate the flow of a test current $I_T$ which is indicative of proper positioning of the board 2 relative to the test probe and relative to the electrode array 1. As a rule, one can assume that the orientation of the test probe or probes 3 is correct, i.e., the absence of a test current $I_T$ will normally indicate that the orientation or position of the board 2 requires correction. The just described test with the circuit 43 of FIG. 14 or an analogous circuit can be carried out at several spaced apart points of the board 2 which is about to be tested, for example, at two, three or each of the four corners of a rectangular or square board 2.

Figure 16:
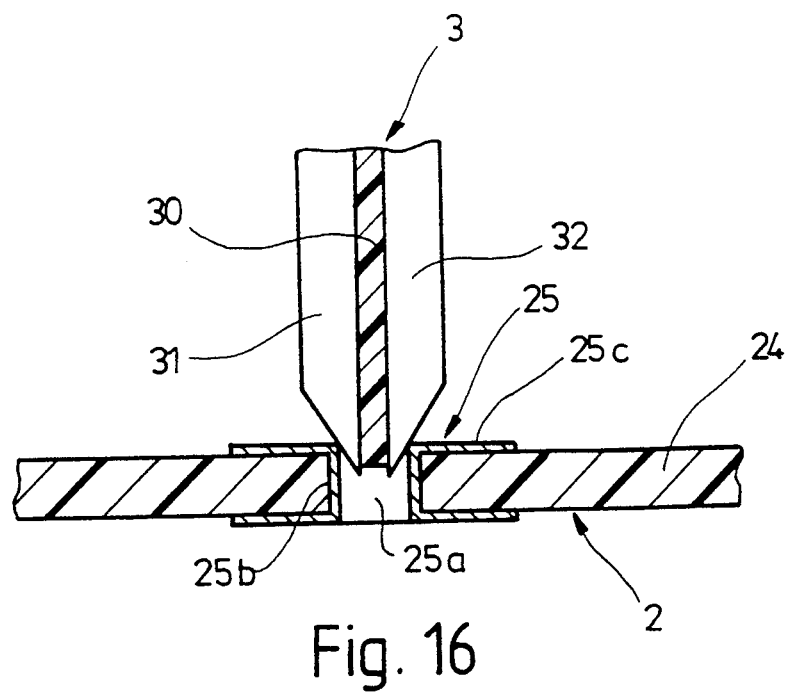
FIG. 16 illustrates the proper position of a twin test probe relative to a printed circuit board having a plated-through bore or hole.

FIG. 16 shows the advantages of a twin-section probe 3 in connection with the testing of a board 2 which has one or more plated-through bores or holes 25a and wherein at least some holes 25a are surrounded by hollow rivet-shaped portions of conductors 25. The tapering tip of the probe 3 enters the hole 25a and each of the two sections 31, 32 contacts the annular portion 25b of the respective conductor 25 whereby the testing circuit 43 (not shown in FIG. 16) indicates that the probe 3 properly engages the adjacent conductor 25 and is ready for the actual testing operation, either in a manner as described with reference to FIG. 1 or in a manner as described with reference to FIG. 5. No test current can flow if the tip of the section 31 or 32 contacts the adjacent radially extending flange 25c of the conductor 25.

Figure 17:
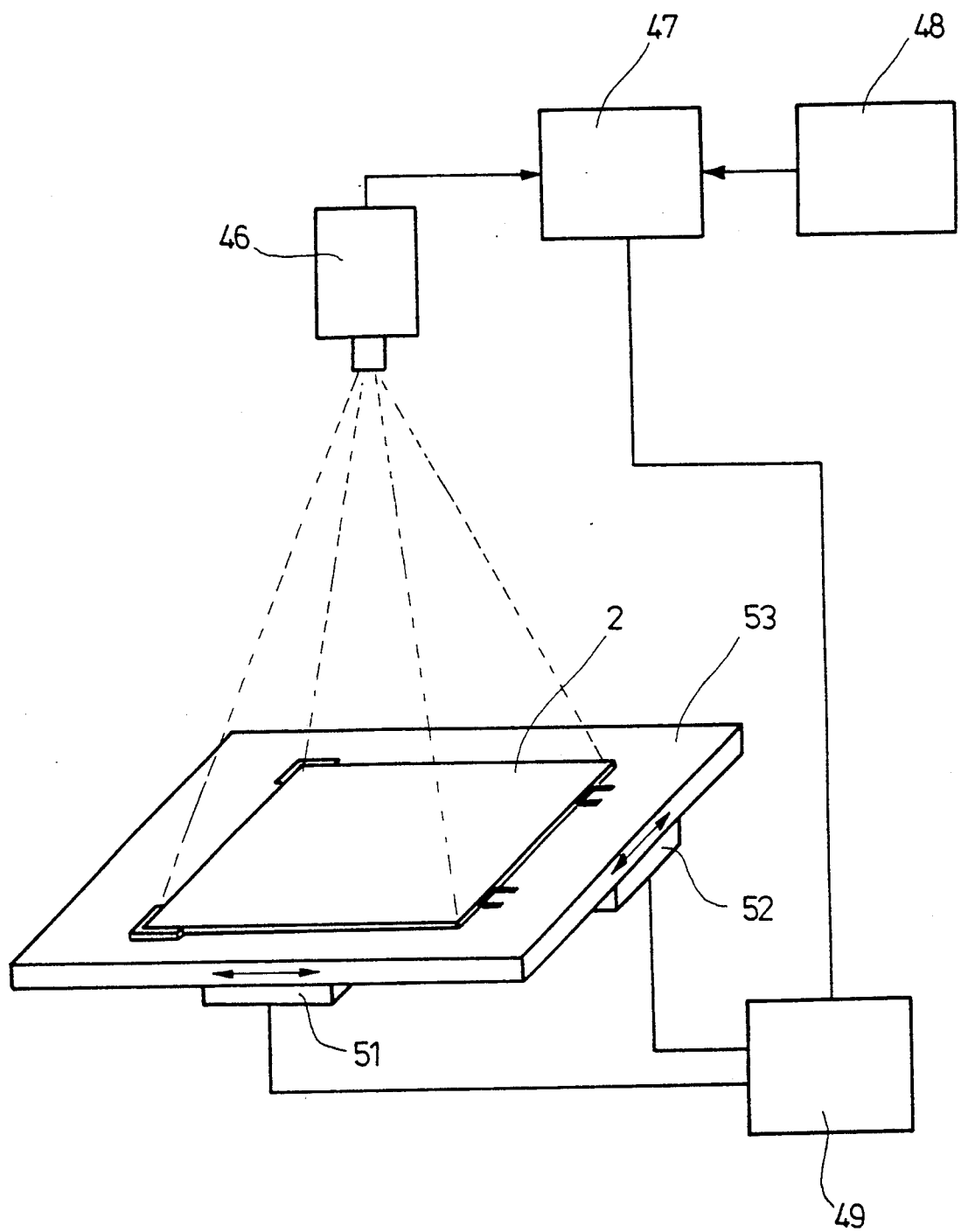
FIG. 17 illustrates an optical system for transmission of signals to means moving an object to be tested to an optimum position relative to the component parts of the improved testing apparatus.

FIG. 17 illustrates another presently preferred mode of properly positioning a board 2 to be tested relative to an array 1 of electrodes. The positioning and moving unit 4 of FIG. 17 employs a camera 46 which observes the board 2 on a table or support 53 of the unit 4. The image of the board 2 is used to generate signals which are transmitted to a comparator 47. The latter receives reference signals from a memory 48 which stores data pertaining to the proper position of an object relative to the electrodes of the testing apparatus of FIG. 1 or 5. If the information which is received from the memory 48 departs from the information received from the camera 46, the comparator 47 transmits appropriate signals to a position correcting circuit 49 which, in turn, transmits signals to a drive 51 or to a drive 52. The drive 51 can move the table or support 53 in the direction of the Y-axis, and the drive 52 can move the table 53 in the direction of the X-axis. Once the position of the board 2 and the table 53 is corrected, the apparatus of FIG. 1 or the apparatus of FIG. 5 is ready to lower or to otherwise move one or more test probes 3 or 3' into contact with the adjacent conductor or conductors 25.

It is equally possible to monitor the position of the board 2 on the support 53 with a set of photocells (not shown) which transmit appropriate signals to the comparator 47.

Monitoring of the position of a board 2 with reference to the array of electrodes in the apparatus of FIG. 1 or 5 can be carried out in a manner as shown in and as described in connection with FIG. 17 in addition to or in lieu of monitoring in a manner as described with reference to FIGS. 14 and 15, i.e., with a test current $I_T$. The camera 46 can compare the position of the board 2 on the support or table 53 with the position of a reference object, e.g., a transparent or translucent board.

Figure 18:
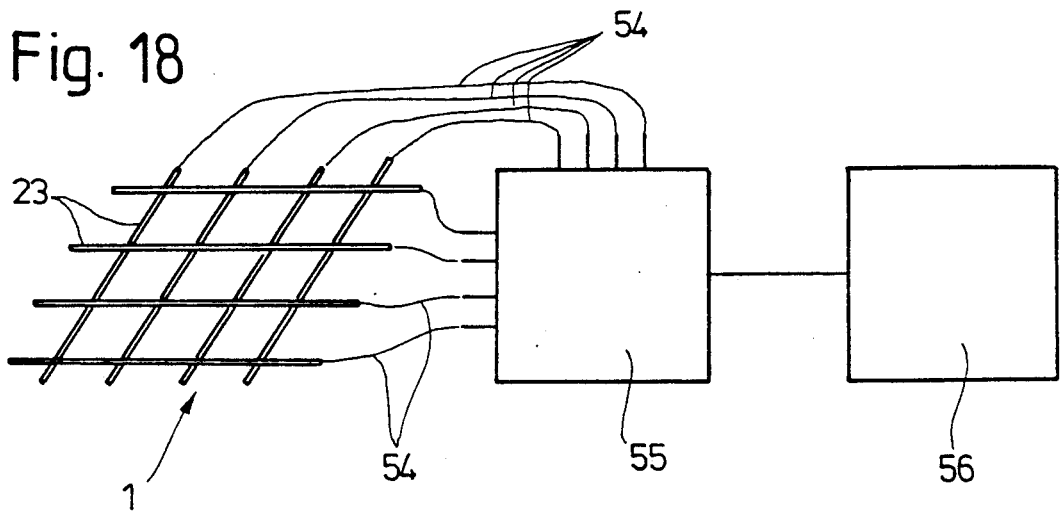
FIG. 18 illustrates an array of wire-like electrodes which are connected to a voltage generator by way of a multiplexer.

FIG. 18 shows an array 1 comprising a grating of wire-like electrodes 23 which form part of an array 1 and are electrically insulated from each other and are connected with leads 54. The leads 54 are further connected to an electronic circuit 55, e.g., a multiplexer, corresponding to the multiplexer 7 of FIG. 1. The multiplexer is connected with a voltage generator 56 corresponding to the generator 8 of FIG. 1. The generator 56 transmits to the electrodes 23 voltage signals which are used to establish an electric field which, in turn, is used to set up an electric potential at selected conductors of the board which is being tested.

Figure 19:
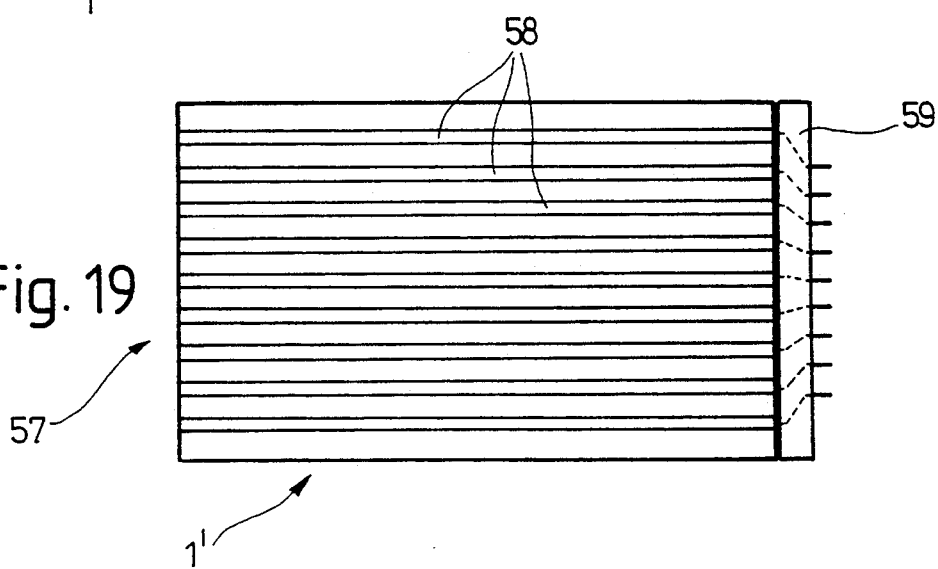
FIG. 19 is a plan view of a different array of electrodes in the form of parallel strips which are embedded into or applied to the exterior of a deformable and puncturable sheet-like carrier.

Referring to FIG. 19, there is shown a modified array 1' including a deformable and penetrable (puncturable) sheet-like carrier 57 for strip-shaped electrodes 58. The carrier 57 is made of an insulating material, and the electrodes 58 are or can be embedded in such insulating material. The electrodes 58 are connected to the multiplexer 7 of FIG. 1 or 5 by a set of plugs 59 or other suitable connectors. FIG. 19 shows that the electrodes 58 are parallel to and are spaced apart from one another. The carrier 57 can constitute a relatively thin foil or suitable insulating plastic material. The strip-shaped electrodes 58 are thin and, therefore, they are readily flexible the same as the carrier 57.

Figure 20:
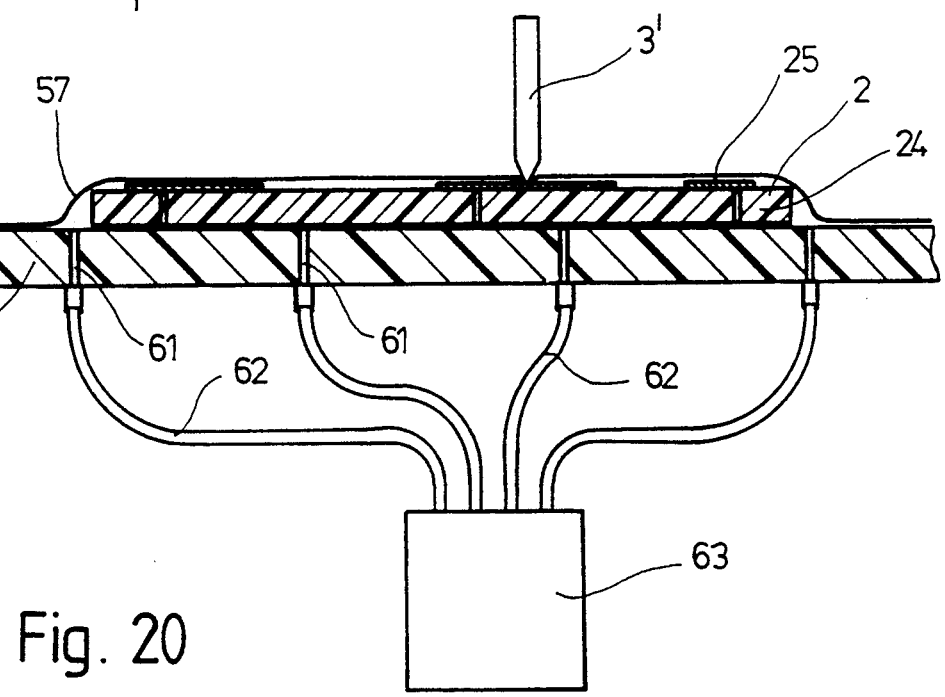
FIG. 20 illustrates the array of FIG. 19 in actual use for testing a printed circuit board.

FIG. 20 shows the array 1' of FIG. 19 in actual use during testing of a board 2 having an insulating substrate 24 for a set of conductors 25. The median conductor 25 is contacted by the tip of a test probe 3', and such tip has penetrated through the carrier 57 between two neighboring strip-shaped electrodes 58 so that the electrodes are not electrically connected with the test probe. The underside of the board 2 abuts the upper side of a table or support 60 which is made of an insulating material and is provided with through holes 61 constituting suction ports and forming part of means for pneumatically urging the carrier 57 and its electrodes 58 against the upper side of the board 2 as well as against the upper side of the support 60. Such urging means further comprises a suction generating device 63 (e.g., a vacuum pump or a fan) and flexible conduits or hoses 62 which connect the inlets of the suction generating device 63 with the ports 61.

When the board 2 on the support 60 is to be tested, the carrier 57 is caused to overlie the board 2 in such a way that it also overlies the support 60 along the edges of the board. If the suction generating device 63 is then activated, suction in the ports 61 attracts the carrier to the board 2 as well as to the support 60. The strip-shaped electrodes 58 cannot contact the adjacent conductors 25 because they are embedded in the insulating material of the carrier 57. In order to carry out a test, selected electrodes 58 are connected with the multiplexer 7 of FIG. 1 and hence with the voltage generator 8 so that they apply to the board 2 an inhomogeneous electric field which sets up an electric potential at certain conductors 25. The characteristics of such potential are determined by the probe or probes 3' which transmit appropriate signals to the evaluating circuit 6 of FIG. 1 via channel 5. As already mentioned above, the unit 4 which serves to move the probes 3' is designed in such a way that the pointed tip of the probe 3' penetrates through the adjacent portion of the carrier 57 between two neighboring strip-shaped electrodes 58 and contacts the selected test point of the adjacent conductor 25.

If the substrate 24 of FIG. 20 supports two sets or groups of conductors 25, one at each of its sides, the apparatus can operate with two carriers 57, one at each side of the substrate. Each of the two carriers 57 can be attracted to the respective side of the substrate 24 by suction.

An advantage of flexible foil-like carriers 57 is that they permit the substrate 24 to flex, for example, in response to the exertion of a substantial force by the tips of the test probes 3 or 3' in the course of a testing operation. The carrier or carriers 57 bend with the substrate 24 so that the electric field remains unchanged. The force with which the tips of the test probes 3 or 3' engage a carrier 57 suffices to ensure that the tips penetrate through the respective carrier and come into contact with the test points of selected conductors 25.

Figure 21:
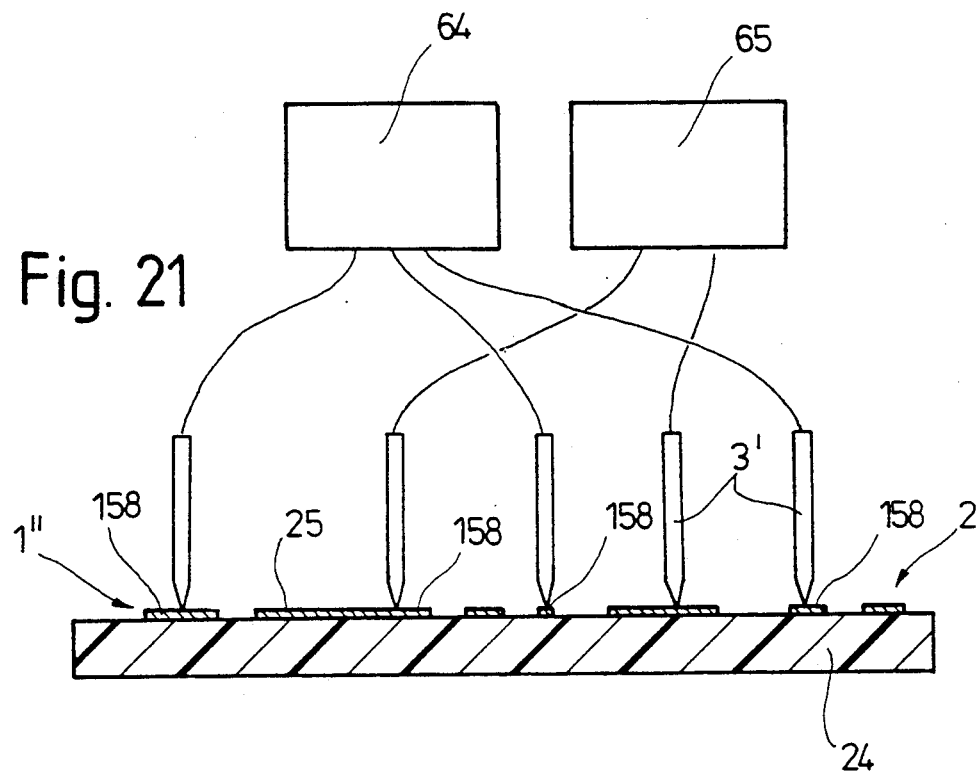
FIG. 21 is a diagrammatic view of a portion of an apparatus wherein certain conductors of an object to be tested constitute an array of electrodes.

FIG. 21 shows a board 2 with two sets or groups of conductors. One set of conductors (numbered 25) must be tested, and the other set of conductors (numbered 158) forms an array 1" which performs the function of the aforediscussed array 1 or 1'. An energy source 64 is connected to the probes 3' which contact the electrodes 158, and an evaluating circuit 65 is connected with the probes 3' which contact the conductors 25. The electrodes 158 establish an inhomogeneous electric field which sets up an electric potential at the conductors 25, and these conductors are thereupon tested in a manner as described with reference to FIG. 1.

When the testing of the conductors 25 is completed, the conductors 25 are connected to the energy source 64 and the electrodes (conductors) 158 are then connected to the evaluating circuit 65. Thus, the functions of the conductors 25 and the electrodes 158 are reversed in order to use the conductors 25 as electrodes which apply an electric field to the former electrodes (now conductors) 158.

Figure 22:
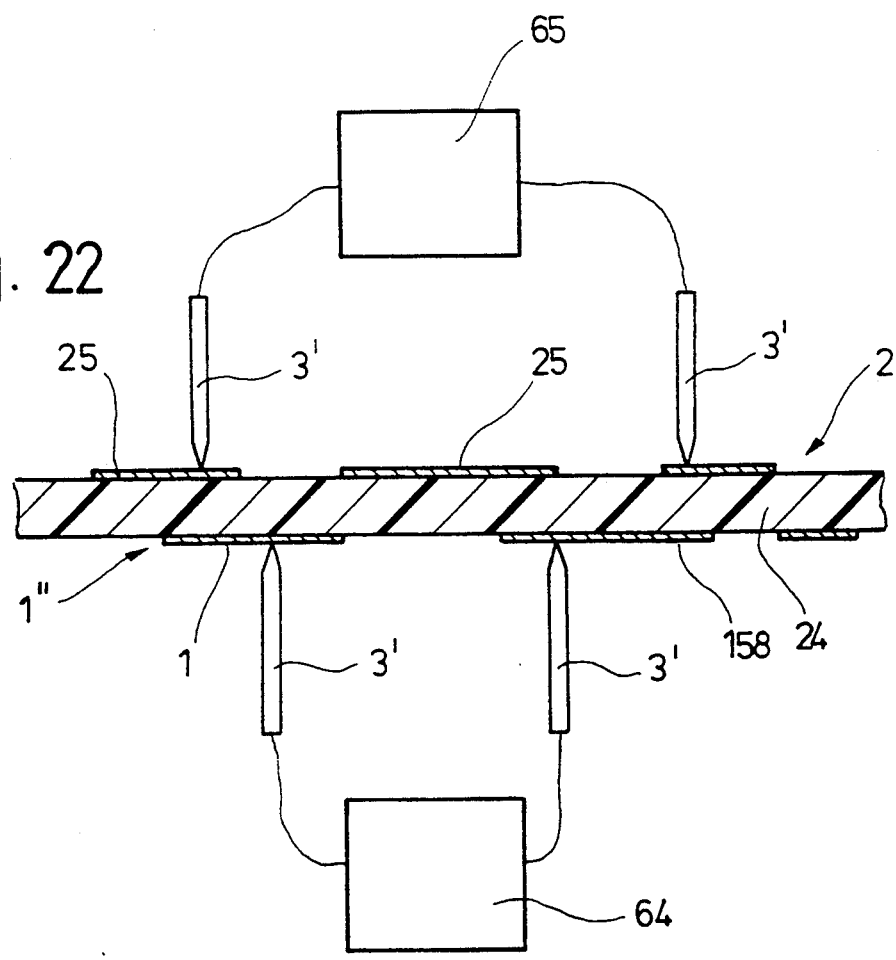
FIG. 22 is a diagrammatic view of a portion of an apparatus which constitutes a modification of the apparatus of FIG. 21.

FIG. 21 shows that the conductors or electrodes 25 and the electrodes or conductors 158 are located at the same (upper) side of the substrate 24. As shown in FIG. 22, the conductors 25 can be applied to one side and the electrodes 158 can be applied to the other side of the substrate 24 of a board 2 which is to be tested. The upper test probes 3' then serve to connect the conductors 25 with the evaluating circuit 65, and the lower test probes 3' serve to connect the electrodes 158 with the energy source 64. Once the testing of the conductors 25 is completed, the board 2 can be turned upside down so that the conductors 25 become electrodes and are connected to the energy source 64 whereas the electrodes 158 become conductors and are connected to the evaluating circuit 65.

If the apparatus which includes the structure of FIG. 21 or 22 is used to test the conductors in several stages, one set of conductors (such as the conductors 25) is being tested while the other set of conductors (158) serves as an array (1") of electrodes. If desired, the situation is thereupon reversed, i.e., the conductors 158 are tested and the conductors 25 are used as electrodes. This renders it possible to dispense with a discrete electrode array 1 or 1'.

The structure of FIG. 21 or 22 can be modified in a number of ways without departing from the spirit of the invention. For example, a multi-layer printed circuit board can comprise one or more layers of conductors which must be tested, and an additional layer of conductors which together constitute an array of electrodes or some of which constitute an array of electrodes. Thus, a board 2 can carry its own array of electrodes, and such array can form part of the conductors to be tested or it can be provided in addition to the conductors for the sole purpose of performing the function of the array 1 of FIG. 1 or 5.

In accordance with a further embodiment of the invention, the electrodes of an array which is to apply an electric field can be connected to a source of potential to set up an inhomogeneous electric field. The electric field can be influenced as a result of the selection of electrodes which are connected with a source of potential. As mentioned above, it is desirable and presently preferred to establish the aforediscussed inhomogeneousness in order to obtain reliable and accurate measurement results.

Figure 23:
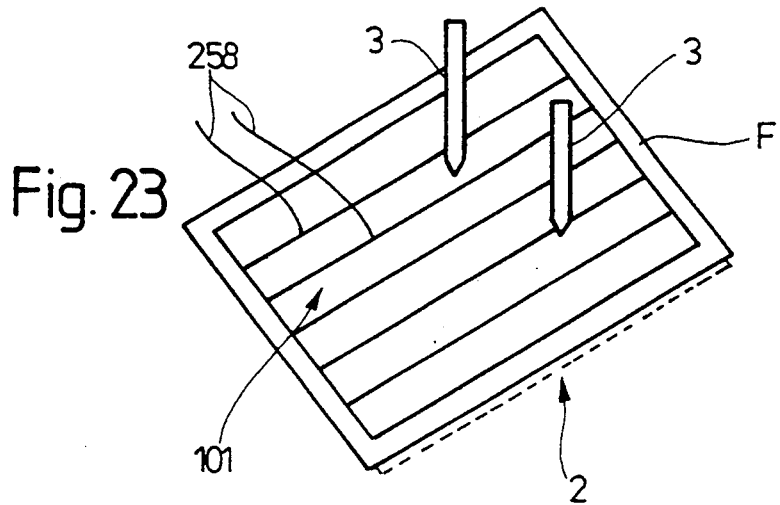
FIG. 23 shows a presently preferred array of electrodes.

It is further within the purview of the invention to employ an array 101 of electrodes 258 which are spaced apart from each other and are installed in an insulating frame F as shown in FIG. 23. The electrodes 258 can constitute rails or bars and are spaced apart from and parallel to each other. This provides ample room for lowering of test probes 3 or 3' (two probes 3 are shown in FIG. 23) into contact with the conductors 25 of the board 2 (indicated by broken lines) beneath the frame F.

The frame F of FIG. 23 can be replaced with a panel (not shown) which carries an array of electrodes 23, 58, 158 or 258. Such panel can be utilized in the apparatus of FIG. 1 or in the apparatus of FIG. 5 in lieu of the array 1, especially for testing of conductors at one side of the substrate of a printed circuit board. The electrodes on the panel apply an electric field or are placed into the electric field which is produced by the object to be tested. The object to be tested is placed onto or moved adjacent the panel.

Figure 24:
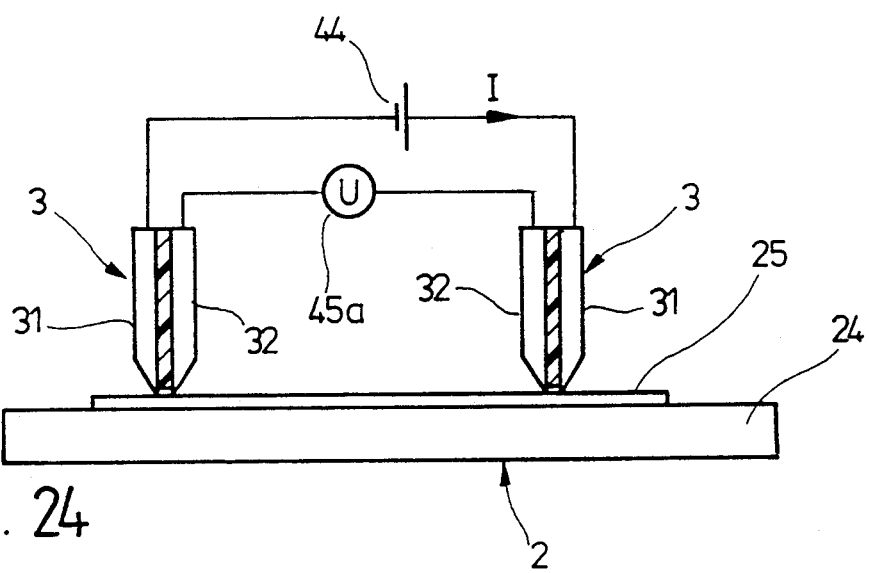
FIG. 24 shows a pair of twin test probes in the course of carrying out a guarding step.

The mode of utilizing pairs of twin test probes 3 for the purpose of guarding is shown in FIG. 24. The sections 31 serve to convey a testing current I in a circuit further including an energy source 44 and a conductor 25 on the substrate 24 of a board to be tested. The sections 32 cooperate with a voltmeter 45a to ascertain the voltage at the test points of the conductor 25. The illustrated method exhibits the advantage that the pairs of twin probes 3 eliminate non-reproducible transition or contact resistance and lead resistance. This cannot be achieved with test probes 3'.

It is of particular advantage if the testing involves the determination of capacitance by ascertaining the current which flows to a conductor 25. When the electric field is constant per unit of time, the current constitutes the quasi charging current of the capacitor whose plates establish the electric field and include one or more selected conductors on the one hand and one or more electrodes of the array of electrodes on the other hand. If the electric field is not constant per unit of time but is an alternating field, one obtains a charging current as well as a constant current (due to the development of capacitance) which can be measured to facilitate the determination of capacitance. Here, again, one can compare the ascertained capacitance values with memorized values in order to ascertain the condition (passability or defectiveness) of the tested conductor or conductors 25.

Figure 25:
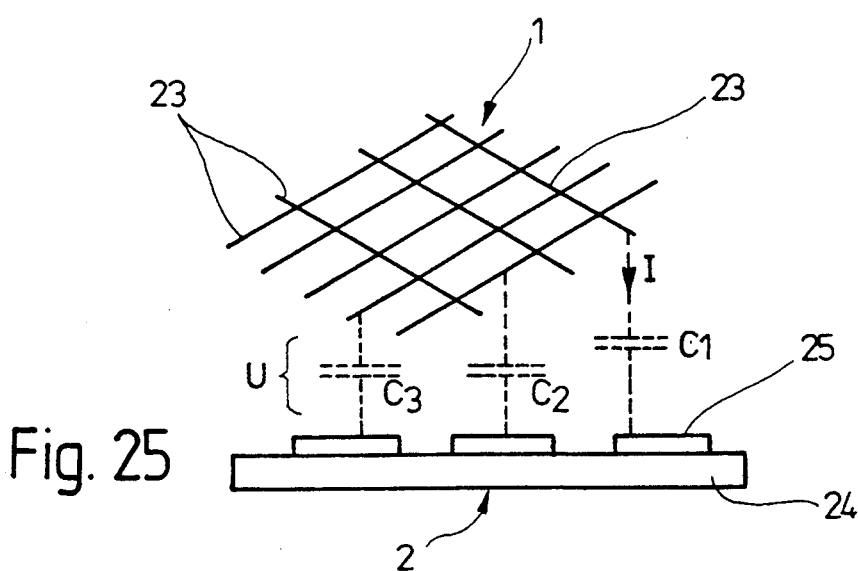
FIG. 25 shows the establishment of capacitors which include conductors to be tested and electrodes forming part of an array of wire-like electrodes.

FIG. 25 shows an array 1 of electrodes 23 adjacent a board 2 having a substrate 24 for a group of conductors 25. Three capacitors $C_1$, $C_2$, $C_3$ are each formed by a conductor 25 and an adjacent electrode 23. If the electric field is constant per unit of time, the charging current is indicative of the respective capacitances. If the electric field is an alternating field, there develops at each of the capacitors $C_1$, $C_2$, $C_3$ a constant current which also permits the determination of capacitance. As mentioned above, the thus determined capacitance values are compared with reference values to ascertain the condition of the respective conductors 25. Reference values are obtained as a result of testing of a passable specimen.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of our contribution to the art and, therefore, such adaptations should and are intended to be comprehended within the meaning and range of equivalence of the appended claims.

We claim:

1. Apparatus for testing electric conductors on a substrate for defects including open and short circuits, comprising means for producing an electric field of non-uniform field strength which can induce unequal electric potentials in electric conductors located in different parts of the field; means for generating signals representative of the induced electric potentials; and means for evaluating said signals to establish whether an induced electric potential is indicative of a defect in one of said conductors.

2. The apparatus of claim 1, wherein said signal generating means includes at least one test probe.

3. The apparatus of claim 1, wherein said producing means includes an array of electrodes.

4. The apparatus of claim 3, wherein said array includes a plurality of electrodes and said producing means further comprises a voltage generator and means for connecting said generator with selected electrodes of said array.

5. The apparatus of claim 1, wherein one of said producing means and signal generating means comprises an array of electrodes which are disposed in a plane adjacent a testing station receiving a substrate for electric conductors to be tested.

6. The apparatus of claim 1, wherein one of said producing means and signal generating means comprises a deformable sheet-like carrier, and an array of electrodes mounted on said carrier.

7. The apparatus of claim 6, wherein said electrodes include strips of conductive material.

8. The apparatus of claim 6, further comprising a support for a substrate carrying electric conductors to be tested, and means for pneumatically urging said carrier against the substrate when the substrate is on said support and said carrier is juxtaposed with the substrate.

9. The apparatus of claim 8, wherein said urging means includes a suction generating device.

10. The apparatus of claim 6, wherein at least one of said producing means and signal generating means comprises at least one test probe for effecting penetration of said carrier so as to contact at least one test point of a conductor.

11. The apparatus of claim 1, wherein at least one of said producing means and signal generating means comprises at least one probe and means for moving said at least one probe in three directions which are inclined relative to each other.

12. The apparatus of claim 11, wherein said moving means includes means for moving said at least one test probe in a predetermined plane in two of said directions and in the third of said directions, substantially at right angles to said plane, toward and away from the conductors to be tested.

13. The apparatus of claim 1, wherein one of said producing means signal generating means comprises an array of electrodes, a voltage generator and a multiplexer arranged to connect said generator with selected electrodes of said array.

14. The apparatus of claim 13, wherein said multiplexer is connected with and is arranged to receive control signals from said evaluating means.

15. The apparatus of claim 1 for testing a first set of electric conductors on a substrate which further carries a second set of conductors, one of said producing means and signal generating means including said second set of conductors.

16. The apparatus of claim 1, wherein one of said producing means and signal generating means comprises an array of electrodes on a substrate for the conductors to be tested.

17. The apparatus of claim 1 for testing electric conductors which form at least one first layer which is carried by a substrate, one of said producing means and signal generating means comprising an array of electrodes forming at least one second layer which is carried by the substrate.

18. A method of testing electrical conductors on a substrate for electric defects including open and short circuits, comprising the steps of producing a nonuniform electric field to induce unequal electric potentials in selected conductors; generating signals representative of the electric potentials; and evaluating said signals to establish whether an induced electric potential is indicative of a defect in one of said selected conductors, said evaluating step including comparing the generated signals with one another, with reference signals or with both.

19. The method of claim 18, wherein said producing step includes exposing the selected conductors to an electric field produced by an array of electrodes.

20. The method of claim 18, wherein the selected conductors define an array of electrodes and said producing step includes supplying voltage impulses to additional conductors and positioning the array of electrodes in the resulting electric field.

21. The method of claim 18, wherein said signal generating step includes contacting selected test points of the conductors with at least one conductive element.

22. The method of claim 21, wherein the at least one conductive element is a test probe.

23. The method of claim 22, wherein the test probe is a twin test probe having two current conducting sections which are electrically insulated from each other.

24. The method of claim 23, wherein the sections are separated from each other by a layer of insulating material.

25. The method of claim 23, wherein said signal generating step includes carrying out a guarding step with a plurality of twin test probes.

26. The method of claim 23, further comprising the step of moving a substrate carrying the selected conductors to a predetermined position prior to said producing step, including contacting at least one conductor with the twin probe, connecting the probe with a source of testing current, and changing the positions of the at least one conductor and the probe relative to each other until the testing current flows through the at least one conductor between the sections of the probe.

27. The method of claim 26, further comprising the step of generating a defect signal in the absence of current flow between the sections of the test probe.

28. The method of claim 26, further comprising the steps of repeating said contacting, connecting and position changing steps in connection with at least one additional conductor on the substrate.

29. The method of claim 18, further comprising the step of moving a substrate carrying the selected conductors to a predetermined position prior to said producing step, including optically detecting the position of the substrate and comparing the detected position with the position of a reference substrate.

30. The method of claim 29, wherein the reference substrate has a light transmitting board.

31. The method of claim 18 of testing a plurality of the selected conductors which should be electrically insulated from each other, wherein said producing step includes applying an electric field to each of said plurality of conductors and said evaluating step includes comparing the signals for said plurality of conductors with each other.

32. The method of claim 31, wherein said comparing of the signals for said plurality of conductors includes ascertaining the identity or lack of identity of the signals.

33. The method of claim 31, wherein said comparing of the signals for said plurality of conductors includes ascertaining the differences or lack of differences between the signals.

34. The method of claim 18, wherein said producing step includes exposing the selected conductors to an electric field produced by a group of electrodes which define capacitors with the selected conductors, said signal generating step comprising ascertaining the capacitances of said capacitors, and said ascertaining including supplying to the conductors an electric current and monitoring the current.

35. The method of claim 34, wherein said evaluating step comprises comparing an ascertained capacitance with a reference capacitance for determination of open and/or short circuits.

36. The method of claim 18, further comprising the steps of positioning a substrate carrying the selected conductors adjacent an array of electrodes and alternatingly utilizing the array to apply an electric field to the conductors on the thus positioned substrate and to generate said signals.

37. The method of claim 18 of testing printed circuit boards of the type having at least two sets of conductors carried by an insulating substrate, said producing step including utilizing one of said at least two sets to apply an electric field to the conductors of the other of said at least two sets.

38. The method of claim 18, wherein said producing step comprises utilizing a first group of conductors on a substrate to apply an electric field to a second group of conductors on the substrate.

* * * * *

UNITED STATES PATENT AND TRADEMARK OFFICE
CERTIFICATE OF CORRECTION

PATENT NO. : 5,268,645
DATED : December 7, 1993
INVENTOR(S) : Manfred PROKOPP

It is certified that error appears in the above-indentified patent and that said Letters Patent is hereby corrected as shown below:

On the cover page, item [19] "Prokoff et al." should read --Prokopp et al.--
On cover page, item [75] "Manfred Prokoff" should read
--Manfred Prokopp--.

Signed and Sealed this

Eighteenth Day of October, 1994

Attest:

BRUCE LEHMAN

*Attesting Officer*        *Commissioner of Patents and Trademarks*

UNITED STATES PATENT AND TRADEMARK OFFICE
CERTIFICATE OF CORRECTION

PATENT NO. : 5,268,645
DATED : December 7, 1993
INVENTOR(S) : Manfred PROKOPP

It is certified that error appears in the above-indentified patent and that said Letters Patent is hereby corrected as shown below:

On the title page, item [73], change "Recholzheim" to --Reicholzheim--.

Signed and Sealed this

Twenty-seventh Day of December, 1994

Attest:

BRUCE LEHMAN

*Attesting Officer*  *Commissioner of Patents and Trademarks*